(12) United States Patent
Choi et al.

(10) Patent No.: US 11,063,036 B2
(45) Date of Patent: Jul. 13, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Hyo Seok Choi, Hwaseong-si (KR); Chul Sung Kim, Seongnam-si (KR); Jae Eun Lee, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 15/683,050

(22) Filed: Aug. 22, 2017

(65) Prior Publication Data

US 2018/0151556 A1    May 31, 2018

(30) Foreign Application Priority Data

Nov. 30, 2016 (KR) .................. 10-2016-0161857

(51) Int. Cl.
| | |
|---|---|
| *H01L 29/78* | (2006.01) |
| *H01L 21/8234* | (2006.01) |
| *H01L 23/485* | (2006.01) |
| *H01L 27/06* | (2006.01) |
| *H01L 49/02* | (2006.01) |
| *H01L 29/775* | (2006.01) |
| *H01L 27/088* | (2006.01) |
| *H01L 29/66* | (2006.01) |
| *H01L 29/06* | (2006.01) |

(52) U.S. Cl.
CPC .. *H01L 27/0629* (2013.01); *H01L 21/823431* (2013.01); *H01L 27/0886* (2013.01); *H01L 28/20* (2013.01); *H01L 28/24* (2013.01); *H01L 29/0649* (2013.01); *H01L 29/6656* (2013.01); *H01L 29/66484* (2013.01); *H01L 29/66545* (2013.01); *H01L 29/66795* (2013.01); *H01L 29/775* (2013.01); *H01L 29/7831* (2013.01); *H01L 29/7855* (2013.01); *H01L 23/485* (2013.01); *H01L 29/0673* (2013.01)

(58) Field of Classification Search
CPC ................................... H01L 21/76805
See application file for complete search history.

(56) References Cited

U.S. PATENT DOCUMENTS

| | | |
|---|---|---|
| 5,159,430 A | 10/1992 | Manning et al. |
| 5,330,930 A | 7/1994 | Chi |
| 5,578,854 A | 11/1996 | Chen et al. |
| 5,804,470 A | 9/1998 | Wollesen |
| 6,300,180 B1 | 10/2001 | Chang et al. |
| 6,340,834 B1 | 1/2002 | Rolfson et al. |
| 7,214,990 B1 | 5/2007 | Lee et al. |
| 9,178,000 B1 | 11/2015 | Nardi et al. |
| 9,184,226 B2 | 11/2015 | McMullan et al. |
| 9,240,404 B2 | 1/2016 | Lim et al. |
| 9,330,971 B2 | 5/2016 | Beasor et al. |
| 2013/0175596 A1* | 7/2013 | Cheng ............ H01L 21/823814 257/310 |

(Continued)

*Primary Examiner* — Xiaoming Liu
(74) *Attorney, Agent, or Firm* — Lee IP Law, P.C.

(57) ABSTRACT

A semiconductor device includes a substrate, a first recess formed in the substrate, a first source/drain filling the first recess, a vertical metal resistor on the first source/drain, and an insulating liner separating the metal resistor from the first source/drain, with the vertical metal resistor being between two gate electrodes.

20 Claims, 24 Drawing Sheets

(56) References Cited

U.S. PATENT DOCUMENTS

| | | | |
|---|---|---|---|
| 2015/0243663 A1* | 8/2015 | Hung | H01L 21/823821 257/365 |
| 2016/0020294 A1* | 1/2016 | Koo | H01L 29/511 257/288 |
| 2016/0343815 A1* | 11/2016 | Wang | H01L 21/823481 |
| 2017/0125535 A1* | 5/2017 | Niimi | H01L 21/7685 |
| 2018/0083115 A1* | 3/2018 | Clifton | H01L 29/517 |

* cited by examiner

SEMICONDUCTOR DEVICE AND METHOD FOR FABRICATING THE SAME

CROSS-REFERENCE TO RELATED APPLICATION

Korean Patent Application No. 10-2016-0161857, filed on Nov. 30, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

A multigate transistor has been suggested as a scaling technology to increase density of semiconductor devices. The multigate transistor may include a silicon body in a fin or nanowire shape on a substrate, with gates formed on a surface of the silicon body. Such multigate transistor allows easy scaling, as it uses a three-dimensional channel. Further, current control capability can be enhanced without requiring increased gate length of the multigate transistor. Furthermore, it is possible to effectively suppress short channel effect (SCE) which is the phenomenon that the electric potential of a channel region is influenced by the drain voltage.

SUMMARY

According to an aspect of embodiments, there is provided a semiconductor device, including a substrate, a first recess formed in the substrate, a first source/drain filling the first recess, a metal resistor formed vertically on the first source/drain and an insulating liner for separating the metal resistor apart from the first source/drain.

According to another aspect of embodiments, there is provided a semiconductor device, including a substrate, first and second gate electrodes extending in parallel in a first direction on the substrate, first and second gate spacers formed on side surfaces of the first and second gate electrodes, respectively, a first recess formed between the first and second gate electrodes, a source/drain filling the first recess, a second recess having the first and second gate spacers as sidewalls and the upper surface of the source/drain as a bottom surface, a metal resistor filling the second recess on the source/drain and an insulating liner between the metal resistor and the source/drain to prevent contact between the metal resistor and the source/drain.

According to still another aspect of embodiments, there is provided a semiconductor device, including a substrate comprising first and second regions, first and second recesses formed in the substrate, respectively, in the first and second regions, first and second source/drains filling the first and second recesses, respectively, an insulating liner formed on the first source/drain, a metal resistor formed on the insulating film, a silicide formed on the second source/drain and a metal contact formed on the silicide.

According to an aspect of embodiments, there is provided a method for fabricating a semiconductor device, including forming first and second dummy gate electrodes extending in parallel in a first direction on a substrate, forming first and second gate spacers on side surfaces of the first and second dummy gate electrodes, respectively, and in the substrate, forming a first source/drain between the first and second gate electrodes, forming an insulating liner on the first source/drain and on the insulating liner, forming a metal resistor between the first and second gate spacers.

According to an aspect of embodiments, there is provided a semiconductor device, including a substrate, a first recess formed in the substrate, a first source/drain filling the first recess, a vertical metal resistor on the first source/drain, the vertical metal resistor having a linear shape in top view, and an insulating liner separating the metal resistor from the first source/drain.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, a semiconductor device according to some exemplary embodiments will be described with reference to FIGS. 1 to 4.

Figure 1:
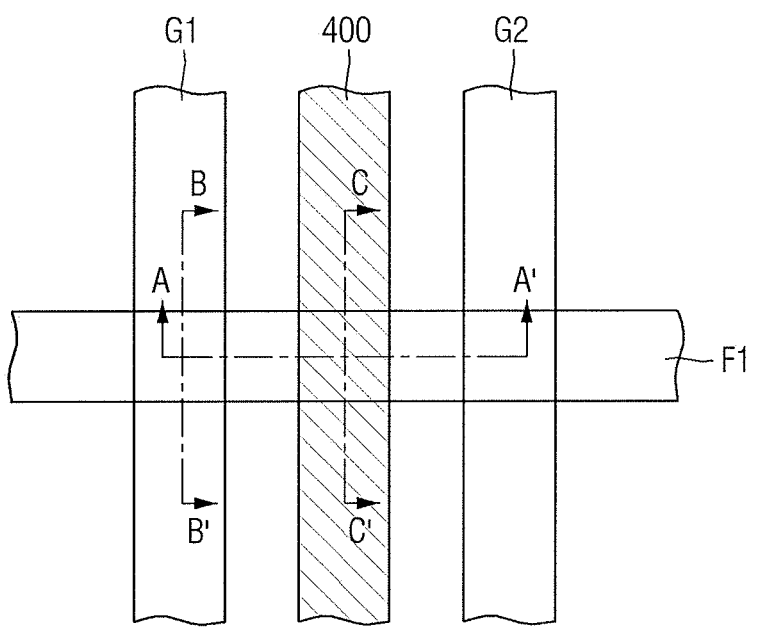
FIG. 1 illustrates a layout diagram of a semiconductor device according to some exemplary embodiments.
Figure 1:
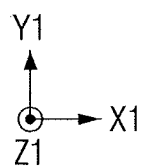
Figure 2:
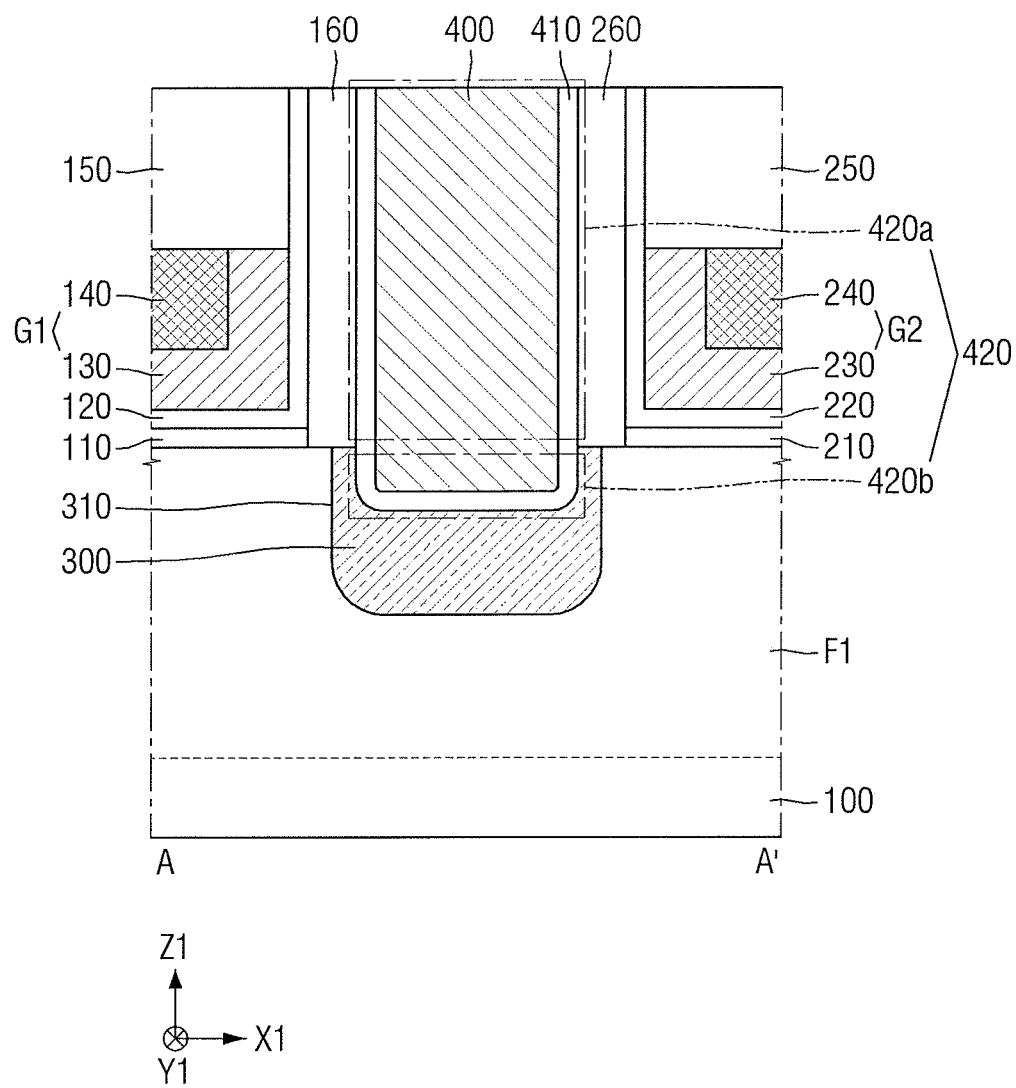
FIG. 2 illustrates a cross sectional view taken along line A-A' of FIG. 1.
Figure 3:
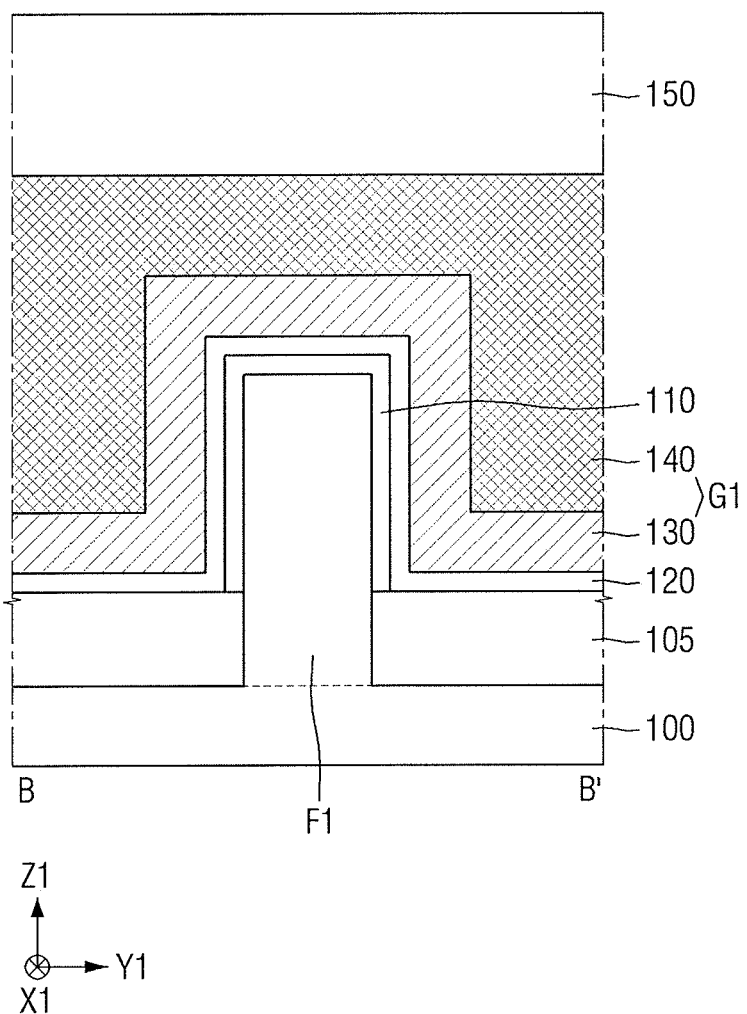
FIG. 3 illustrates a cross sectional view taken along line B-B' of FIG. 1.
Figure 4:
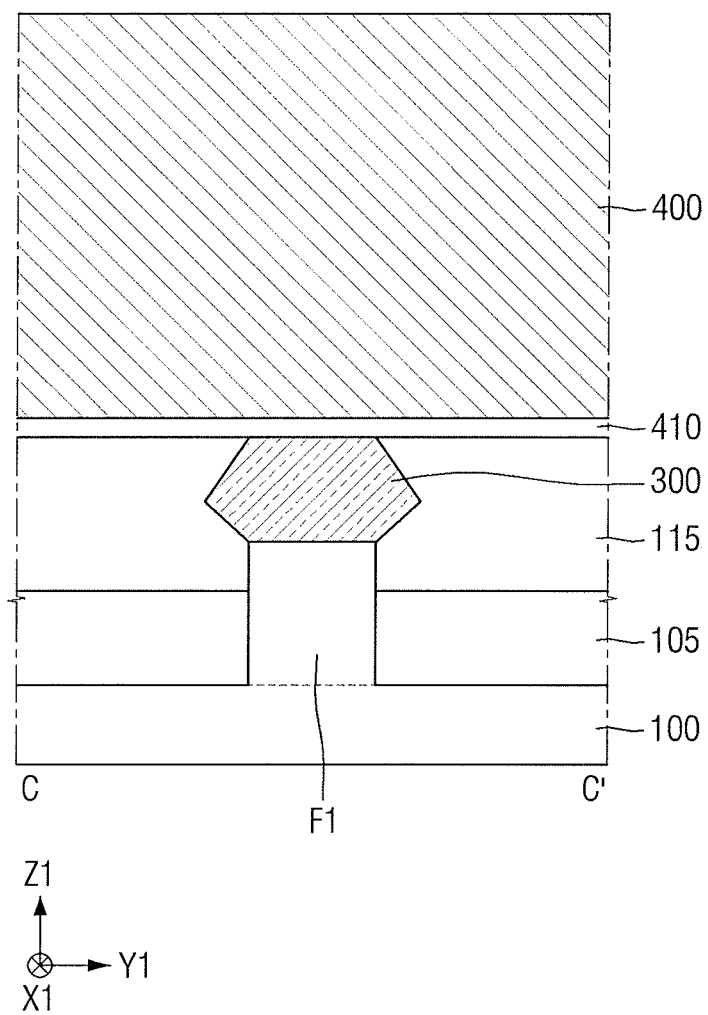
FIG. 4 illustrates a cross sectional view taken along line C-C' of FIG. 1.

FIG. 1 is a layout diagram provided to explain a semiconductor device according to some exemplary embodiments, and FIG. 2 is a cross sectional view taken along A-A' of FIG. 1. FIG. 3 is a cross sectional view taken along line B-B' of FIG. 1, and FIG. 4 is a cross sectional view taken along line C-C' of FIG. 1.

Referring to FIGS. 1 to 4, a semiconductor device according to some exemplary embodiments may include a substrate 100, a first fin F1, first and second gate electrodes G1 and G2, a first source/drain 300, and a metal resistor 400.

For example, the substrate 100 may be a bulk silicon or a silicon-on-insulator (SOI). In another example, the substrate 100 may be a silicon substrate, or may include other materials, e.g., silicon germanium, indium antimonide, lead telluride compound, indium arsenide, indium phosphide, gallium arsenide, or gallium antimonide. In yet another example, the substrate 100 may be a base substrate having an epitaxial layer formed thereon.

Referring to FIG. 1, the first fin F1 may extend, e.g., elongate, in a first direction X1. As illustrated in FIG. 1, the first fin F1 may have a rectangular shape, although exemplary embodiments are not limited thereto. If the first fin F1 is in a rectangular shape, the first fin F1 may include long sides extending in the first direction X1 and short sides extending in a second direction Y1. The second direction Y1 may be the direction that is not parallel to, but intersects the first direction X1.

The first fin F1 may be formed by partially etching the substrate 100, and may include an epitaxial layer grown from the substrate 100. The first fin F1 may include an element semiconductor material, e.g., silicon or germanium. Further, the first fin F1 may include a compound semiconductor, e.g., IV-IV group compound semiconductor or III-V group compound semiconductor.

For example, in the case of the IV-IV group compound semiconductor, the first fin F1 may be a binary compound or a ternary compound including at least two or more of, e.g., carbon (C), silicon (Si), germanium (Ge) or tin (Sn), or these compounds doped with IV group element. In another example, in the case of III-V group compound semiconductor, the first fin F1 may be one of a binary compound, a ternary compound or a quaternary compound which is formed by a combination of a III group element which may be at least one of, e.g., aluminum (Al), gallium (Ga), or indium (In), with a V group element which may be one of phosphorus (P), arsenic (As) or antimony (Sb).

In some exemplary embodiments, the first fin F1 may be a nanowire structure having a stack of silicon and silicon germanium intersecting each other. However, in the following description, it is assumed that the first fin F1 of a semiconductor device according to exemplary embodiments includes silicon.

As illustrated in FIG. 3, a field insulating film 105 may partially surround a side surface of the first fin F1. That is, the field insulating film 105 may expose an upper portion of the first fin F1. For example, the field insulating film 105 may include at least one of silicon oxide, silicon nitride, silicon oxynitride, or a low-k dielectric material with a smaller dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

As illustrated in FIG. 1, the first gate electrode G1 and the second gate electrode G2 may extend parallel to each other. The first gate electrode G1 and the second gate electrode G2 may extend in the second direction Y1. The first gate electrode G1 and the second gate electrode G2 may be spaced apart from each other in the first direction X1.

The first gate electrode G1 and the second gate electrode G2 may extend in the second direction Y1. The first gate electrode GI and the second gate electrode G2 may each intersect the first fin F1. That is, the first gate electrode G1 and the second gate electrode G2 may each include a portion which is overlapped with the first fin F1, as illustrated in FIG. 3. That is, the first fin F1 may include an overlapping portion and a non-overlapping portion with the first gate electrode G1 and the second gate electrode G2, respectively.

Referring to FIGS. 2 and 3, the first gate electrode G1 may include a first work function metal 130 and a first fill metal 140. The first work function metal 130 plays a role of adjusting a work function, and the first fill metal 140 plays a role of filling the space formed by the first work function metal 130.

The second gate electrode G2 may include a second work function metal 230 and a second fill metal 240. The second work function metal 230 plays a role of adjusting a work function, and the second fill metal 240 plays a role of filling the space formed by the second work function metal 230. The first work function metal 130 and the second work function metal 230 may be, e.g., an N-type work function metal, a P-type work function metal, or a combination thereof.

In some exemplary embodiments, when the semiconductor device is a PMOS, the first work function metal 130 and the second work function metal 230 may be a combination of an N-type work function metal and a P-type work function metal. For example, the first work function metal 130 and the second work function metal 230 may include at least one of, e.g., TiN, WN, TiAl, TiAlN, TaN, TiC, TaC, TaCN, TaSiN, or a combination thereof, but not limited thereto.

In some exemplary embodiments, when the semiconductor device is an NMOS, the first work function metal 130 and the second work function metal 230 may be an N-type work function metal. For example, the first work function metal 130 and the second work function metal 230 may include at least one of, e.g., TiN, WN, TiAl, TiAlN, TaN, TiC, TaC, TaCN, TaSiN, or a combination thereof, but not limited thereto.

Further, the first fill metal 140 and the second fill metal 240 may include at least one of, e.g., W, Al, Cu, Co, Ti, Ta, poly-Si. SiGe, or a metal alloy, but not limited thereto.

For example, the first gate electrode G1 and the second gate electrode G2 may be formed by replacement process or gate last process, but not limited thereto.

First gate insulating films 110 and 120 may be formed between the first fin F1 and the first gate electrode G1, and between the field insulating film 105 and the first gate electrode G1. Second gate insulating films 210 and 220 may be formed between the first fin F1 and the second gate electrode G2, and between the field insulating film 105 and the second gate electrode G2.

The first gate insulating films 110 and 120 may include a first interfacial layer 110 and a first high-k dielectric film 120. The second gate insulating films 210 and 220 may include a second interfacial layer 210 and a second high-k dielectric film 220.

The first and second interfacial layers 110 and 210 may be formed by partially oxidizing the first fin F1. The first and second interfacial layers 110 and 210 may be formed along the profile of the first fin F1 protruding upward higher than the upper surface of the field insulating film 105. When the first fin F1 is a silicon fin-type pattern that includes silicon, the first and second interfacial layers 110 and 210 may include a silicon oxide film.

As illustrated in FIG. 3, the first and second interfacial layers 110 and 210 may not be formed along the upper surface of the field insulating layer 105, but exemplary embodiments are not limited thereto. Depending on methods of forming the first and second interfacial layers 110 and 210, the first and second interfacial layers 110 and 210 may be formed along the upper surface of the field insulating film 105. For example, when the field insulating film 105 does not include silicon oxide, the first and second interfacial layers 110 and 210 may be formed along the upper surface of the field insulating film 105. In another example, when the field insulating film 105 includes silicon oxide, when the silicon oxide included in the field insulating film 105 has different properties from the silicon oxide film included in the first and second interfacial layers 110 and 210, the first and second interfacial layers 110 and 210 may be formed along the upper surface of the field insulating film 105.

The first and second high-k dielectric films 120 and 220 may be each formed between the first and second interfacial layers 110 and 210 and the first and second gate electrodes G1 and G2. The first and second high-k dielectric films 120 and 220 may be formed along the profile of the first fin F1 protruding upward higher than the upper surface of the field insulating film 105. Further, the first and second high-k dielectric films 120 and 220 may be formed between the first and second gate electrodes G1 and G2 and the field insulating film 105.

The first and second high-k dielectric films 120 and 220 may include a high-k dielectric material having a higher dielectric constant than silicon oxide film. For example, the first and second high-k dielectric films 120 and 220 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited thereto.

First and second capping films 150 and 250 may be formed on the first and second gate electrodes G1 and G2, respectively. The first and second capping films 150 and 250 may include at least one of, e.g., silicon oxide film, silicon nitride film, and silicon oxynitride film.

A first gate spacer 160 may be formed on both sides of the first gate electrode G1. A second gate spacer 260 may be formed on both sides of the second gate electrode G2. The first and second gate spacers 160 and 260 may also be formed on both sides of the first and second capping films 150 and 250. That is, the first and second gate spacers 160 and 260 may be formed on respective side surfaces of the structure in which the first and second gate electrodes G1 and G2 and the first and second capping films 150 and 250 are stacked.

As exemplified in the drawings, the first and second gate spacers 160 and 260 may be a single film, but it may be multiple spacers in which a plurality of films are stacked. Shapes of the first and second gate spacers 160 and 260 and respective shapes of the multiple spacers forming the first and second gate spacers 160 and 260 may be I- or L-shape, or a combination thereof depending on the fabrication process and purpose of use.

As illustrated in FIG. 2, a first recess 310 may be formed between the first and second gate electrodes G1 and G2. The first recess 310 may be formed within the first fin F1. That is, the first recess 310 may be formed as the upper surface of the first fin F1 is recessed. The first source/drain 300 may fill the first recess 310. The first source/drain 300 may function as a source/drain of a transistor shared by the first and second gate electrodes G1 and G2.

For example, when the semiconductor device according to some exemplary embodiments is a PMOS, the first source/drain 300 may be a SiGe epitaxial layer. In this case, the first source/drain 300 may be doped with boron (B), or the like. In another example, when the semiconductor device according to some exemplary embodiments is an NMOS, the first source/drain 300 may be a Si or SiC epitaxial layer. In this case, the first source/drain 300 may be doped with phosphorus (P), or the like.

Referring to FIG. 4, an outer circumference of the first source/drain 300 may take on a variety of shapes. For example, the outer circumference of the first source/drain 300 may be at least one of diamond, circle, and rectangle shapes. For example, FIG. 4 illustrates a diamond shape (or pentagon or hexagon shape).

A first interlayer insulating film 115 may be formed on the field insulating film 105. The first interlayer insulating film 115 may be formed on a side surface of the first source/drain 300. For example, the first interlayer insulating film 115 may include at least one of, e.g., silicon oxide, silicon nitride, silicon oxynitride, or a low-k dielectric material with a smaller dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

As illustrated in FIG. 2, a second recess 420 may be formed by partially removing the first source/drain 300. The second recess 420 may be formed between the first and second gate spacers 160 and 260. That is, the first and second gate spacers 160 and 260 may be in a self-aligned configuration which becomes directly the sidewall of the second recess 420.

The second recess 420 may include a second upper recess 420*a* and a second lower recess 420*b*. The second upper recess 420*a* may be formed on the second lower recess 420*b*. Both the bottom surface and the side surface of the second lower recess 420*b* may be in the first source/drain 300, e.g., the second lower recess 420*b* may be formed within the first source/drain 300. The second upper recess 420*a* may be connected to the second lower recess 420*b*, i.e. the second upper recess 420*a* may not have a separate bottom surface, and the side surfaces of the second upper recess 420*a* may be facing outer surfaces of the first and second gate spacers 160 and 260, respectively. For example, as illustrated in FIG. 2, while the second lower recess 420*b* may be formed in the first source/drain 300, and the second upper recess 420*a* may be defined between the first and second gate spacers 160 and 260, sidewalls of the second upper and lower recesses 420*a* and 410*a* may be aligned to define seamless sidewalls of a single recess.

A first insulating liner 410 may be formed, e.g., conformally, along a lower surface and a side surface of the second recess 420. Accordingly, the uppermost portion of the upper surface of the first insulating liner 410 may be flush with the first and second gate spacers 160 and 260, the first and second high-k dielectric films 120 and 220, and the first and second capping films 150 and 250. The first insulating liner 410 may be, e.g., silicon oxide, silicon nitride, and silicon oxynitride. The first insulating liner 410 may electrically insulate the metal resistor 400 and the first source/drain 300, which will be described later.

The metal resistor 400 may fill the second recess 420. The metal resistor 400 may be formed on the first insulating liner 410. The upper surface of the metal resistor 400 may be flush, e.g., level, with the uppermost portion of the upper surface of the first insulating liner 410, the upper surfaces of the first and second gate spacers 160 and 260, the upper surfaces of the first and second high-k dielectric films 120 and 220, and the upper surfaces of the first and second capping films 150 and 250.

The metal resistor 400 may include a metal. The metal resistor 400 may include, e.g., TiN, TaN, TiAl, Ti, TiAlN, W, $W_6$, and the like. The metal resistor 400 is not limited as long as it can form a specific resistance value.

Referring to FIG. 1, the metal resistor 400 may extend in the second direction Y1. The metal resistor 400 may be formed between the first and second gate electrodes G1 and G2. The metal resistor 400 may be disposed between the first and second gate electrodes G1 and G2 in the first direction X1 and may extend, e.g., elongate, in the second direction Y1. For example, referring to FIGS. 1-2, the metal resistor 400 may have a size defined by a spacing between adjacent gate electrodes and a height of the gate electrodes, e.g., to be the same as the height of the gate electrodes.

A related resistor structure is generally a metal structure formed horizontally with a large horizontal area on a dummy gate structure. That is, the related resistor structure may have a large, e.g., wide, horizontal area in a plane parallel to the top of the substrate, while having a small vertical thickness, e.g., sides of the related resistor structure along directions parallel to the top of the substrate may be longer than the thickness of the related resistor along a normal to the top surface of the substrate.

However, as the scale of the semiconductor device itself is reduced, it may be very inefficient to make a resistor with a wide horizontal area. Further, as the dummy gate structure under the related resistor structure is required to have an area similar to that of the related resistor to support the metal structure, costs of the fabrication process may increase due to the large size of the dummy gate structure.

In contrast, a semiconductor device according to some exemplary embodiments employs a vertical resistive structure self-aligned between gate spacers as described above. That is, the metal resistor 400 of the semiconductor device according to some exemplary embodiments is a self-aligned vertical resistance structure between the gate spacers with increased vertical thickness and reduced width, thereby reducing an overall horizontal area of the metal resistor 400 in top view. Accordingly, as an area employed for the metal resistor 400 in top view is reduced, space utilization within the semiconductor device may be improved, e.g., minimized wasted space.

In addition, the metal structure of the related resistor is generally on the dummy gate structure, thereby causing an overall vertical height of the semiconductor device to increase, e.g., as the related resistor extends to a predetermined height above the dummy structure. In contrast, since the metal resistor 400 of the semiconductor device according to some exemplary embodiments is formed at the same height as the first and second gate spacers 160 and 260, the elevation of the vertical height of the semiconductor device is not increased.

The metal resistor 400 of such vertical structure is enabled because the scale of the semiconductor device is reduced such that the required resistive structure thickness is similar to the gate pitch scale. In addition, the semiconductor device according to some exemplary embodiments may form a resistance of a precise specific value by providing electrical insulation between the metal resistor 400 and the first source/drain 300 with the first insulating liner 410. Also, since the width of the metal resistor 400 may be adjusted by using the thickness of the first insulating liner 410, it can be used as a tuning element of the resistance value of the metal resistor 400.

Hereinbelow, a semiconductor device according to some exemplary embodiments will be described with reference to FIG. 5. In the following description, description overlapped with the exemplary embodiments already provided above will not be described or described as briefly as possible for the sake of brevity.

Figure 5:
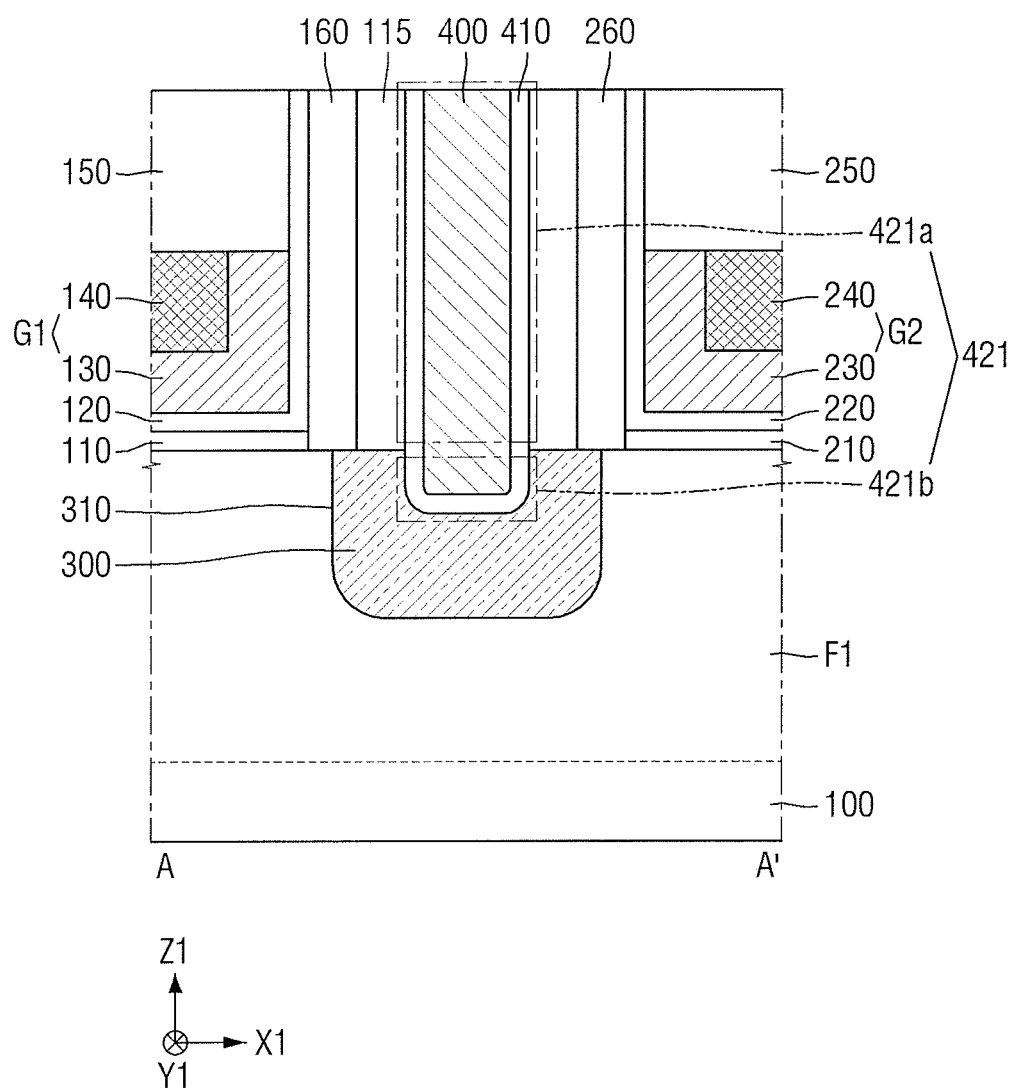
FIG. 5 illustrates a cross sectional view of a semiconductor device according to some exemplary embodiments.

FIG. 5 is a cross sectional view of a semiconductor device according to some exemplary embodiments.

Referring to FIG. 5, in the semiconductor device according to the some exemplary embodiments, the sidewall of a second recess 421 may be the first interlayer insulating film 115.

The second recess 421 may be formed by partially removing the first source/drain 300. The second recess 421 may be formed between the first and second gate spacers 160 and 260. The second recess 421 may be formed through the first interlayer insulating film 115 between the first and second gate spacers 160 and 260. Accordingly, the width of the second recess 421 may be less than the distance between the outer surfaces of the first gate spacer 160 and the second gate spacer 260. Accordingly, the upper surface of the first source/drain 300 may have a portion where the second recess 421 is not formed and this may be covered with the first interlayer insulating film 115.

The second recess 421 may include a second upper recess 421a and a second lower recess 421b. The second upper recess 421a may be formed on the second lower recess 421b. Both the bottom surface and the side surface of the second lower recess 421b may be the first source/drain 300. The second upper recess 421a may be connected to the second lower recess 421b, i.e., the second upper recess 421a may not have a separate bottom surface, and the side surfaces may all be the first interlayer insulating film 115.

The metal resistor 400 of the semiconductor device according to some exemplary embodiments may not be a self-aligned structure. Accordingly, the width of the second recess 421 can be selectively determined by the etching process, and the resistance value of the metal resistor 400 may be easily adjusted.

Hereinbelow, a semiconductor device according to some exemplary embodiments will be described with reference to FIG. 6. In the following description, description overlapped with the exemplary embodiments already provided above will not be described or described as briefly as possible for the sake of brevity.

Figure 6:
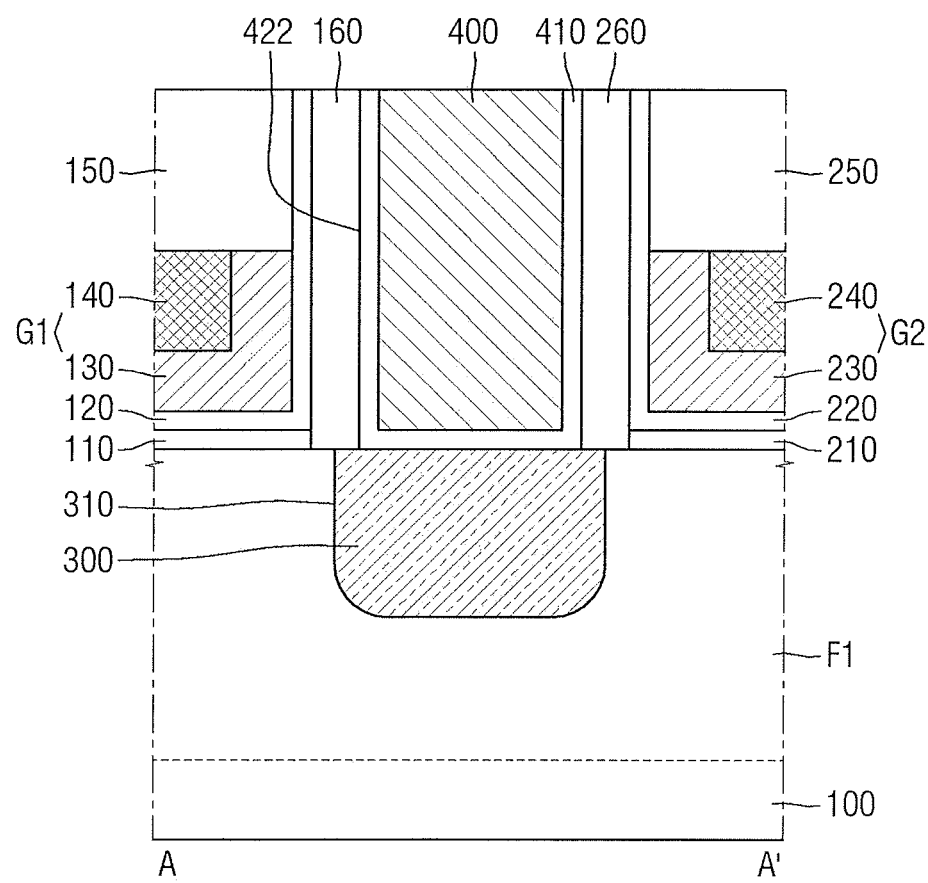
FIG. 6 illustrates a cross sectional view of a semiconductor device according to some exemplary embodiments.

FIG. 6 is a cross sectional view provided to explain a semiconductor device according to some exemplary embodiments.

Referring to FIG. 6, a second recess 422 of the semiconductor device according to some exemplary embodiments may be formed without etching a portion of the first source/drain 300. That is, the metal resistor 400 and the first source/drain 300 may overlap with each other in the third direction Z1 which is the vertical direction, and the horizontal direction may not overlap at all in the first direction X1 and the second direction Y1.

In this case, the first insulating liner 410 may be a part of the etch stop film for setting the end point of the etching of the first interlayer insulating film 115. That is, the second recess 420 may be formed without etching the portion formed with the etch stop film.

Alternatively, the bottom surface portion of the first insulating liner 410 may be the etch stop film, and the side surface portion may be a portion of the etch stop film and the first interlayer insulating layer 115 remaining after removal. In any case, the first insulating liner 410 may perform isolation of the first source/drain 300 and the metal resistor 400.

Since the first source/drain 300 is not etched, the aspect ratio of the second recess 420, in which the metal resistor 400 is formed, is not increased so that the formation of the first insulation liner 410 and the metal resistor 400 may be easy, and the surface of the second recess 422 may be easily etched with a predetermined width. Through such predetermined width, it may become easier to set the resistance value of the metal resistor 400.

Hereinbelow, a semiconductor device according to some exemplary embodiments will be described with reference to FIG. 7. In the following description, description overlapped with the exemplary embodiments already provided above will not be described or described as briefly as possible for the sake of brevity.

Figure 7:
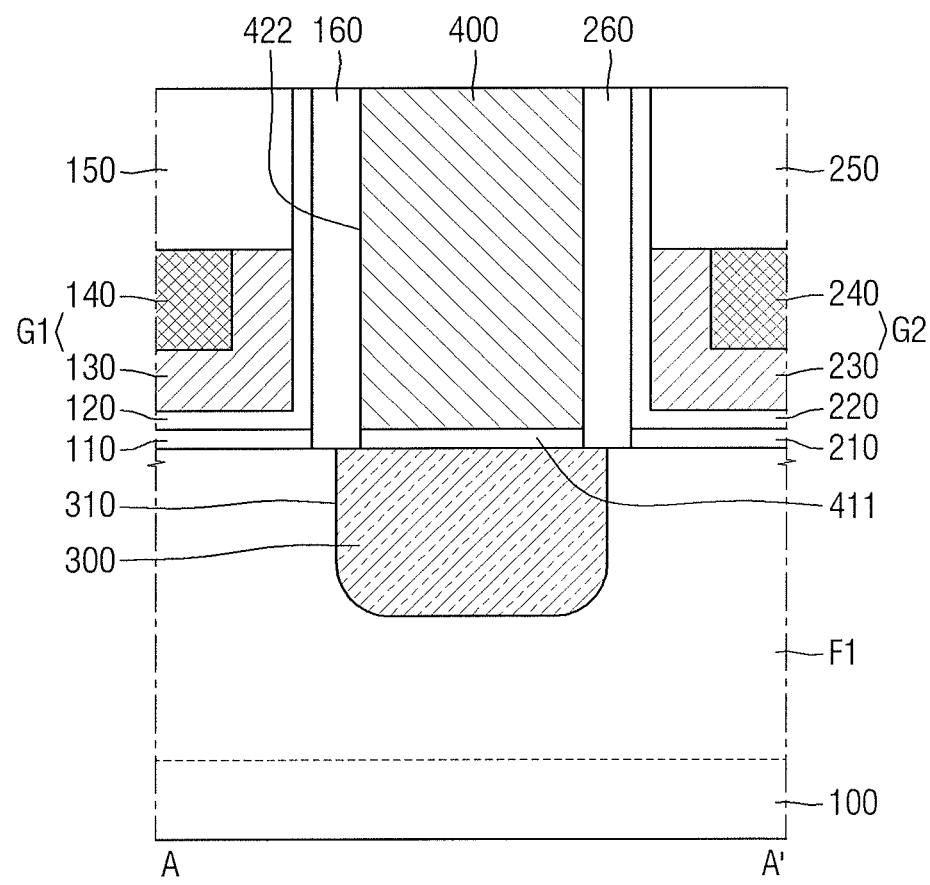
FIG. 7 illustrates a cross sectional view of a semiconductor device according to some exemplary embodiments.

FIG. 7 is a cross sectional view provided to explain a semiconductor device according to some exemplary embodiments.

Referring to FIG. 7, a first insulating liner 411 of the semiconductor device according to some exemplary embodiments may be formed only on the bottom surface of the second recess 422, and may not be formed on the side surface. That is, when the first insulating liner 411, which is the etch stop film, is not removed and remains in the etching step of the first interlayer insulating film 115 for forming the second recess 422, the metal resistor 400 may be directly formed on the remaining first insulating liner 411. As a result, the first and second gate spacers 160 and 260 may be in direct contact with both side surfaces of the metal resistor 400.

Even when the first insulation liner 411 is formed only on the bottom surface as described above, the first source/drain 300 is electrically insulated from the metal resistor 400.

Hereinbelow, a semiconductor device according to some exemplary embodiments will be described with reference to FIGS. 8 to 11. In the following description, description overlapped with the exemplary embodiments already provided above will not be described or described as briefly as possible for the sake of brevity.

Figure 8:
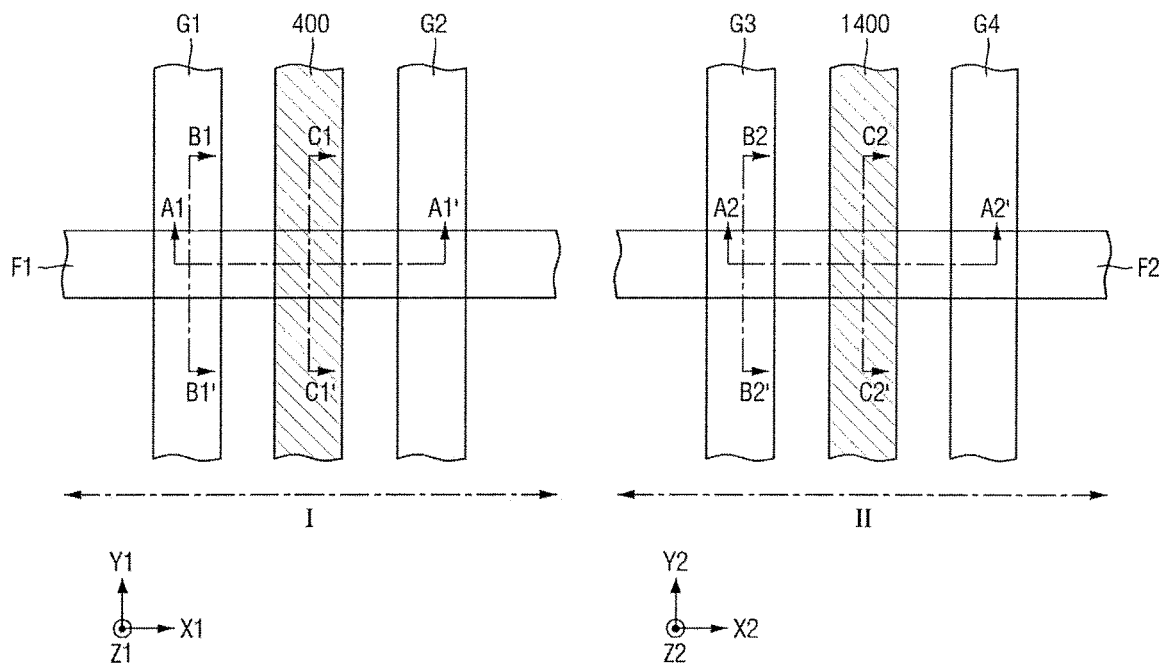
FIG. 8 illustrates a layout diagram of a semiconductor device according to some exemplary embodiments.
Figure 9:
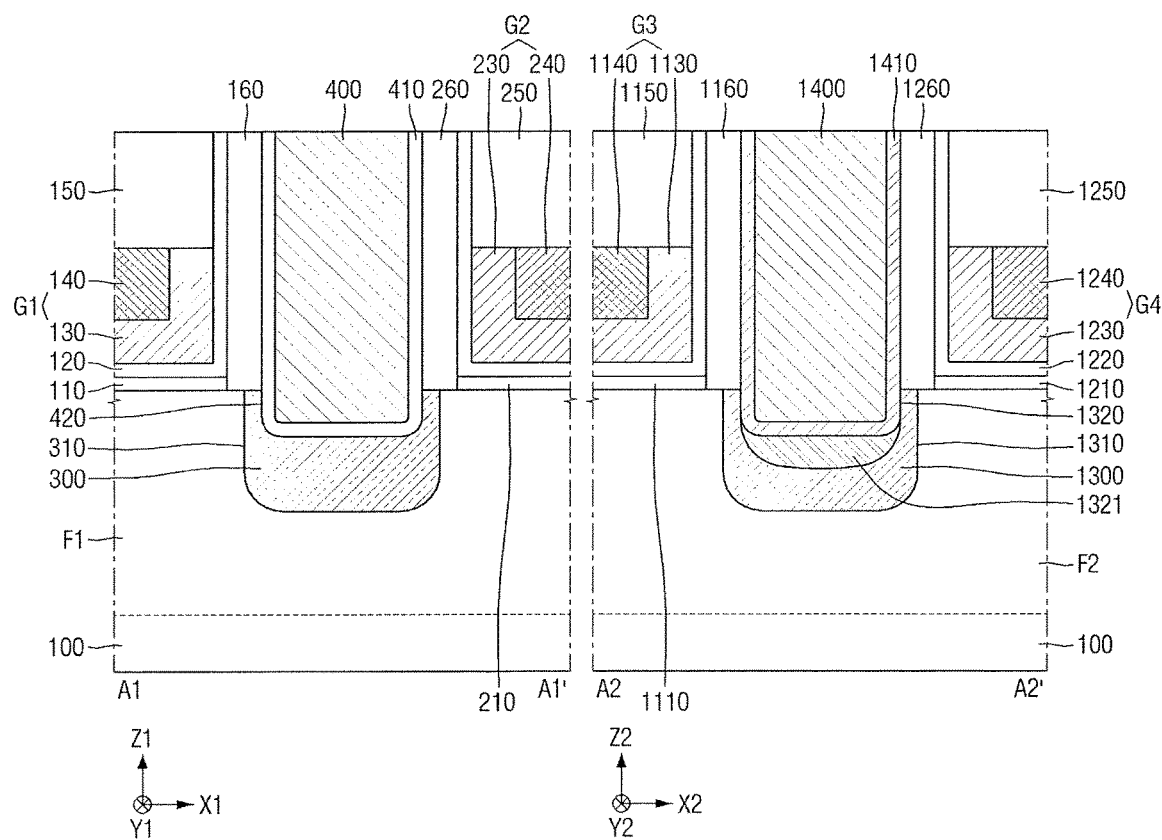
FIG. 9 illustrates cross sectional views taken along lines A1-A1' and A2-A2' of FIG. 8.
Figure 10:
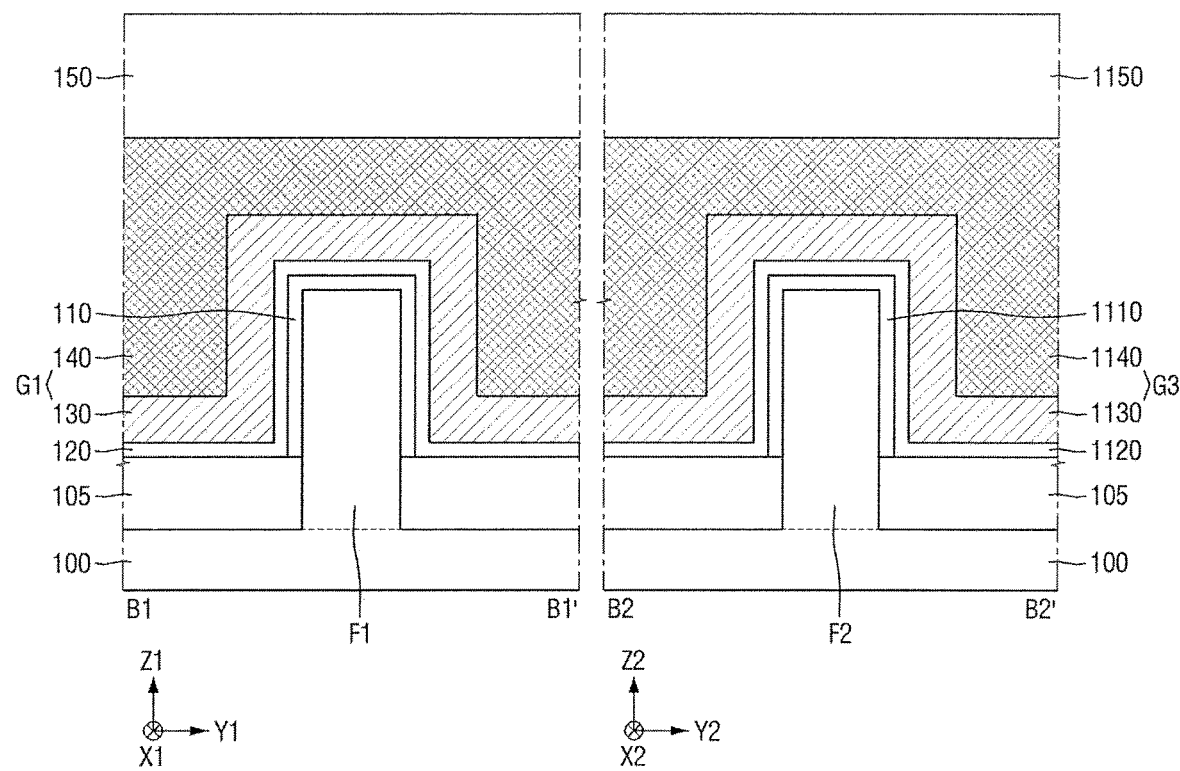
FIG. 10 illustrates cross sectional views taken along lines B1-B1' and B2-B2' of FIG. 8.
Figure 11:
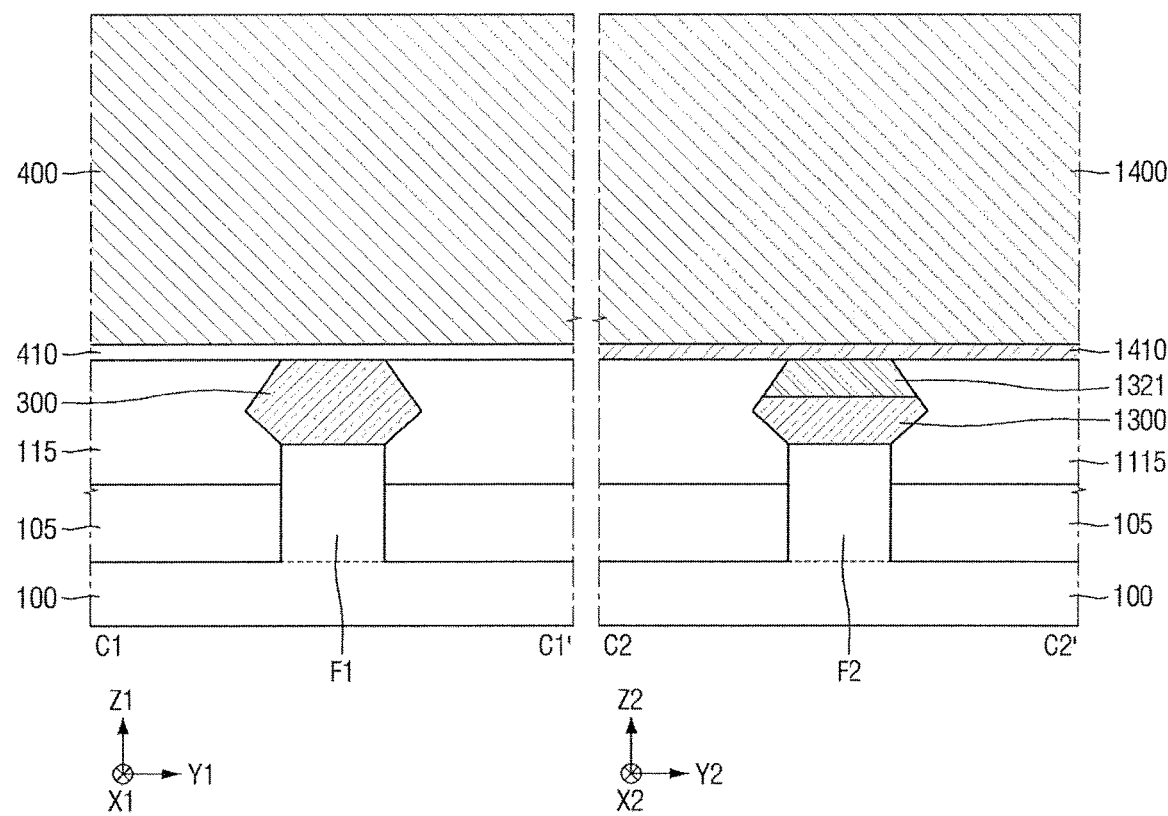
FIG. 11 illustrates cross sectional views taken along lines C1-C1' and C2-C2' of FIG. 8.

FIG. 8 is a layout diagram provided to explain a semiconductor device according to some exemplary embodiments, and FIG. 9 illustrates cross sectional views taken along lines A1-A1' and A2-A2' of FIG. 8. FIG. 10 illustrates cross sectional views taken along lines B1-B1' and B2-B2' of FIG. 8, and FIG. 11 illustrates cross sectional views taken along lines C1-C1' and C2-C2' of FIG. 8.

Referring to FIGS. 8 to 11, the substrate 100 may include first and second regions I and II. The first and second regions I and II may be regions adjacent to each other, or the regions spaced apart from each other. The first region I may be defined by the first to third directions X1, Y1 and Z1, and the second region II may be defined by the fourth to sixth directions X2, Y2 and Z2. In this case, the first to third directions X1, Y1 and Z1 and the fourth to sixth directions X2, Y2 and Z2 may be the same direction or may be different directions from each other.

The first region I in FIGS. 8 to 11 may be substantially the same portion as the semiconductor device described in FIGS. 1 to 4. Therefore, the second region II in FIGS. 8 to 11 will be mainly described.

Referring to FIG. 8, the second fin F2 may extend, e.g., elongate, in the fourth direction X2. If the second fin F2 is in a rectangular shape, the second fin F2 may include long sides extending in the fourth direction X2 and short sides extending in the fifth direction Y2. The fifth direction Y2 may be the direction that is not parallel to, but intersects the fourth direction X2.

In some exemplary embodiments, the second fin F2 may be a nanowire structure having a stack of silicon and silicon germanium intersecting each other. However, in the following description, it is assumed that the second fin F2 of a semiconductor device according to exemplary embodiments includes silicon. The field insulating film 105 may partially fill a side surface of the second fin F2.

The third gate electrode G3 and the fourth gate electrode G4 may extend parallel to each other. The third gate electrode G3 and the fourth gate electrode G4 may extend in the fifth direction Y2. The third gate electrode G3 and the fourth gate electrode G4 may be spaced apart in the fourth direction X2.

Referring to FIGS. 9 and 10, the third gate electrode G3 may include a third work function metal 1130 and a third fill metal 1140. The third work function metal 1130 plays a role of adjusting a work function, and the third fill metal 1140 plays a role of filling the space formed by the third work function metal 1130.

The fourth gate electrode G4 may include a fourth work function metal 1230 and a fourth fill metal 1240. The fourth work function metal 1230 plays a role of adjusting a work function, and the fourth fill metal 1240 plays a role of filling the space formed by the fourth work function metal 1230. The third work function metal 1130 and the fourth work function metal 1230 may be, e.g., an N-type work function metal, a P-type work function metal, or a combination thereof.

Third gate insulating films 1110 and 1120 may be formed between the second fin F2 and the third gate electrode G3, and between the field insulating film 105 and the third gate electrode G3. Fourth gate insulating films 1210 and 1220 may be formed between the second fin F2 and the fourth gate electrode G4, and between the field insulating film 105 and the fourth gate electrode G4.

The third gate insulating films 1110 and 1120 may include a third interfacial layer 1110 and a third high-k dielectric film 1120. The fourth gate insulating films 1210 and 1220 may include a fourth interfacial layer 1210 and a fourth high-k dielectric film 1220.

Third and fourth capping films 1150 and 1250 may be formed between the third and fourth gate electrodes G3 and G4, respectively. Third and fourth gate spacers 1160 and 1260 may be formed on each side surfaces of the structure in which the third and fourth gate electrodes G3 and G4 and the third and fourth capping films 1150 and 1250 are stacked.

A third recess 1310 may be formed between the third and fourth gate electrodes G3 and G4. The third recess 1310 may be formed within the second fin F2. That is, the third recess 1310 may be formed as the upper surface of the second fin F2 is partially recessed.

A second source/drain 1300 may fill the third recess 1310. The second source/drain 1300 may function as a source/drain of a transistor shared by the third and fourth gate electrodes G3 and G4.

A fourth interlayer insulating film 1115 may be formed on the field insulating film 105. The fourth interlayer insulating film 1115 may be formed on a side surface of the second source/drain 1300.

A fourth recess 1320 may be formed by partially etching the second source/drain 1300. The fourth recess 1320 may be formed between the third and fourth gate spacers 1160 and 1260. That is, the third and fourth gate spacers 1160 and 1260 may be in a self-aligned configuration which becomes directly the sidewall of the fourth recess 1320.

A first barrier metal 1410 may be formed along a lower surface and a side surface of the fourth recess 1320. Accordingly, the uppermost portion of the upper surface of the first barrier metal 1410 may be flush with the third and fourth gate spacers 1160 and 1260, the third and fourth high-k dielectric films 1120 and 1220, and the third and fourth capping films 1150 and 1250. The first barrier metal 1410 may include a metal material, e.g., TiN, and so on. The first barrier metal 1410 may improve the surface characteristics of the fourth recess 1320 and facilitate the formation of a first metal contact 1400 which will be described below.

The first metal contact 1400 may fill the fourth recess 1320. The first metal contact 1400 may be formed on the first barrier metal 1410. The upper surface of the first metal contact 1400 may be flush with the uppermost portion of the upper surface of the first barrier metal 1410, the upper surfaces of the third and fourth gate spacers 1160 and 1260, the upper surfaces of the third and fourth high-k dielectric films 1120 and 1220, and the upper surfaces of the third and fourth capping films 1150 and 1250.

The first metal contact 1400 may include a metal. The first metal contact 1400 may include, e.g., TiN, TaN, TiAl, Ti, TiAlN, W, W$_6$, and the like. The first metal contact 1400 is not limited as long as it can form a specific resistance value.

Referring to FIG. 8, the first metal contact 1400 may extend, e.g., elongate, in a fifth direction Y2. The first metal contact 1400 may be formed between the third and fourth gate electrodes G3 and G4. The first metal contact 1400 may be disposed between the third and fourth gate electrodes G3 and G4 in the fourth direction X2 and may extend, e.g., elongate, in the fifth direction Y2. For example, as illustrated in FIGS. 8-9, the first metal contact 1400 and the metal resistor 400 may have a same structure, e.g., same shape and size.

A first silicide 1321 may be formed between the first barrier metal 1410 and the second source/drain 1300. The first silicide 1321 may be formed to enhance resistance characteristics between the first barrier metal 1410 and the second source/drain 1300. Although the first silicide 1321 is illustrated as being formed only under the second recess 420 in the drawings, it is not limited thereto. The first silicide 1321 may be also formed within the second source/drain 1300 which is a side surface of the second recess 420.

Hereinbelow, a semiconductor device according to some exemplary embodiments will be described with reference to FIG. 12. In the following description, description overlapped with the exemplary embodiments already provided above will not be described or described as briefly as possible for the sake of brevity.

Figure 12:
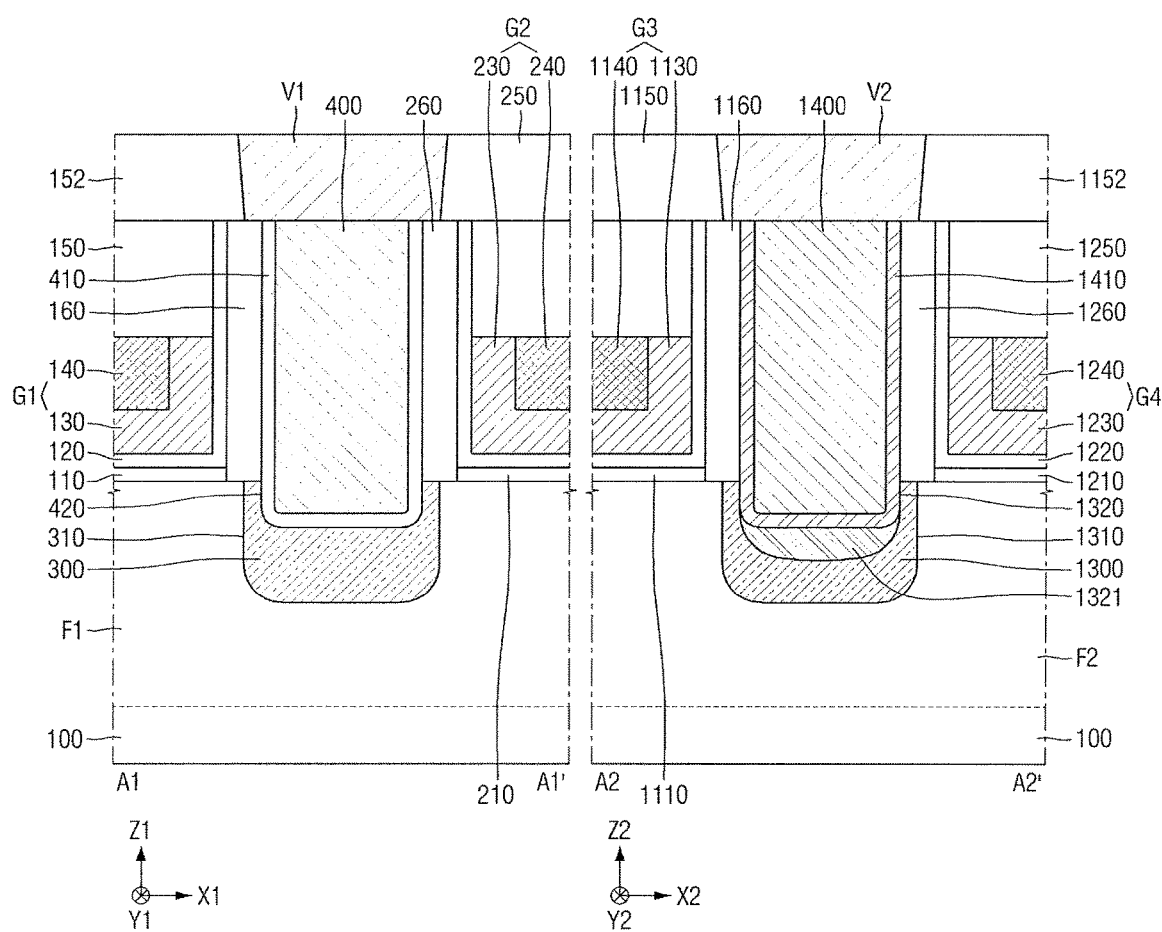
FIG. 12 illustrates a cross sectional view of a semiconductor device according to some exemplary embodiments.

FIG. 12 is a cross sectional view provided to explain a semiconductor device according to some exemplary embodiments.

Referring to FIG. 12, the semiconductor device according to some exemplary embodiments may include a second interlayer insulating film 152, a third interlayer insulating film 1152, a first via V1, and a second via V2.

The second interlayer insulating film 152 may be formed on the first and second gate electrodes G1 and G2, and on the metal resistor 400 in the first region I. The second interlayer insulating film 152 may be a same material as the first interlayer insulating film 115.

The third interlayer insulating film 1152 may be formed on the third and fourth gate electrodes G3 and G4, and on the first metal contact 1400 in the second region II. The third interlayer insulating film 1152 may be a same material as the second interlayer insulating film 152.

The first via V1 may pass through the second interlayer insulating film 152 to electrically connect to the metal resistor 400. The first via V1 may serve to connect the metal resistor 400 to the upper structure.

The second via V2 may pass through the third interlayer insulating film 1152 to electrically connect to the first metal contact 1400. The second via V2 may serve to connect the first metal contact 1400 to the upper structure.

Hereinbelow, a semiconductor device according to some exemplary embodiments will be described with reference to FIGS. 13 and 14. In the following description, description overlapped with the exemplary embodiments already provided above will not be described or described as briefly as possible for the sake of brevity.

Figure 13:
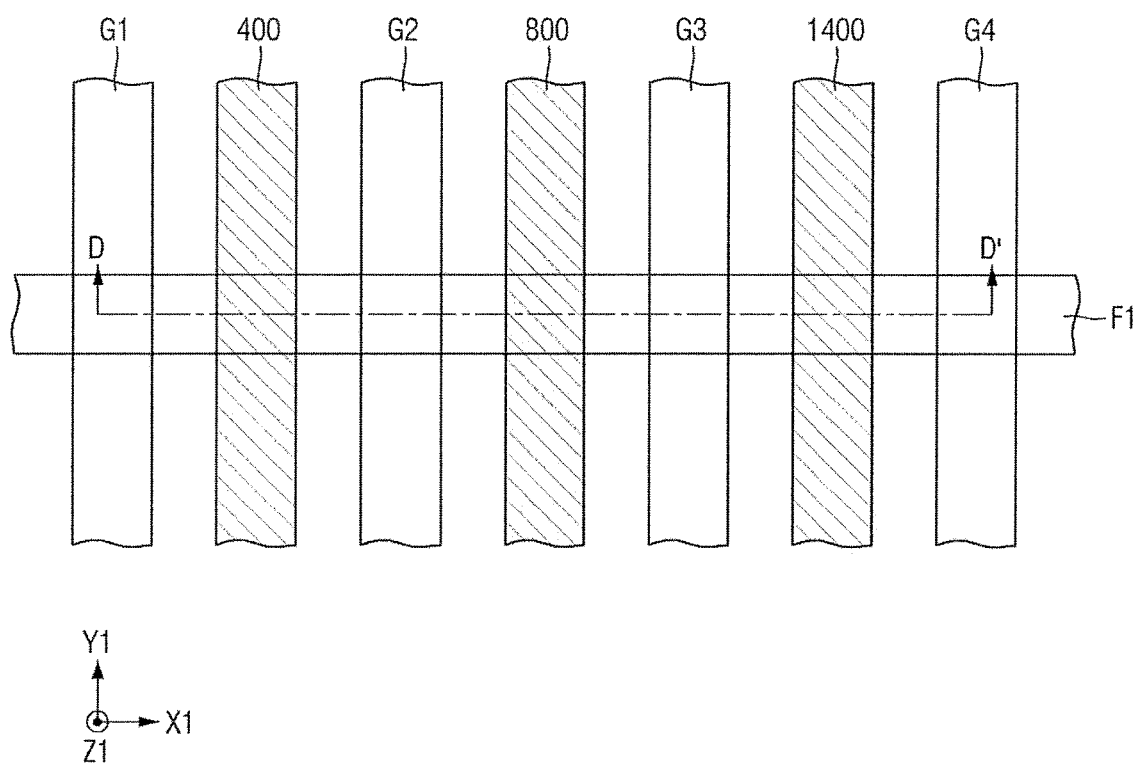
FIG. 13 illustrates a layout diagram of a semiconductor device according to some exemplary embodiments.
Figure 14:
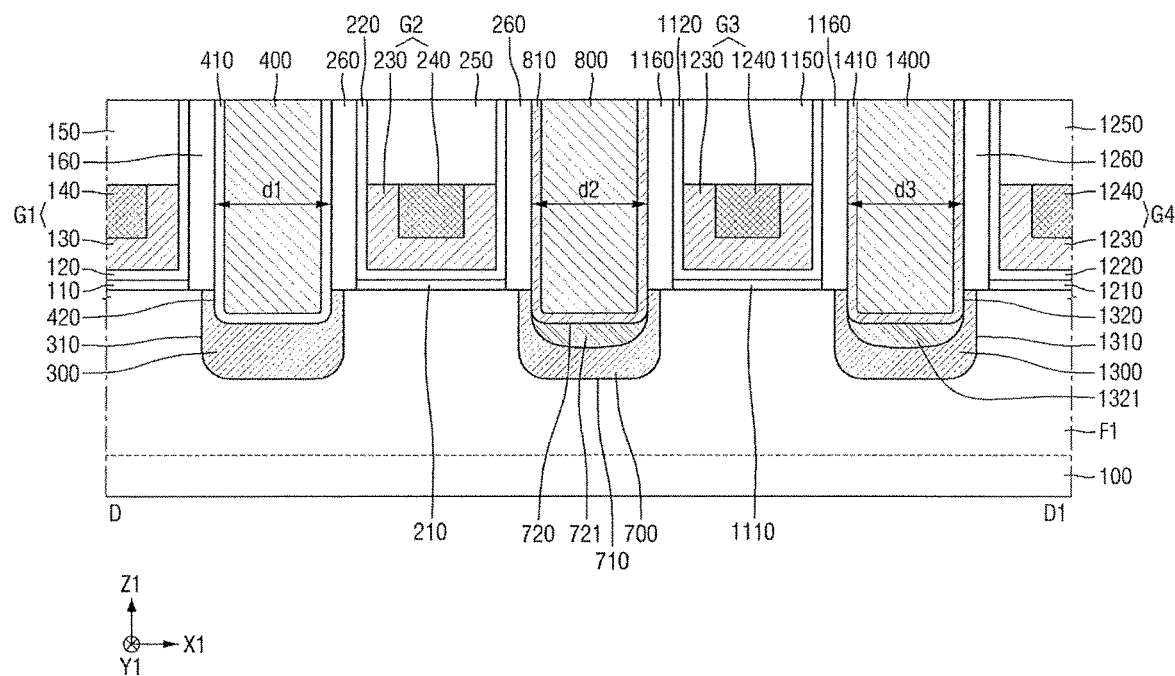
FIG. 14 illustrates a cross sectional view taken along line D-D' of FIG. 13.

FIG. 13 is a layout diagram of a semiconductor device according to some exemplary embodiments, and FIG. 14 is a cross sectional view along line D-D' of FIG. 13.

Referring to FIGS. 13 and 14, in a semiconductor device according to some exemplary embodiments, the first to fourth gate electrodes G1 to G4 may be disposed in parallel, and two metal contacts and one metal resistor may be formed therebetween.

More specifically, the metal resistor 400 may be formed between the first and second gate electrodes G1 and G2, and the first metal contact 1400 may be formed between the third and fourth gate electrodes G3 and G4. Further, a second metal contact 800 may be formed between the second and third gate electrodes G2 and G3.

In the above embodiments, the metal resistor 400 and the first metal contact 1400 have been described. Therefore, the second metal contact 800 will be described below. Note that, in the present embodiment, all the components are formed on the first fin F1 instead of the second fin F2 of the above-described embodiment.

A fifth recess 710 may be formed between the second and third gate electrodes G2 and G3. The fifth recess 710 may be formed within the first fin F1. That is, the fifth recess 710 may be formed as the upper surface of the first fin F1 is partially recessed.

A third source/drain 700 may fill the fifth recess 710. The third source/drain 700 may function as a source/drain of a transistor shared by the second and third gate electrodes G2 and G3.

A sixth recess 720 may be formed by partially etching the third source/drain 700. The sixth recess 720 may be formed between the second and third gate spacers 260 and 1160. That is, the second and third gate spacers 260 and 1160 may be in a self-aligned configuration which becomes directly the sidewall of the sixth recess 720.

Accordingly, the second recess 420, the fourth recess 1320, and the sixth recess 720 all may have the same width. That is, the second recess 420, the fourth recess 1320, and the sixth recess 720 may have a first width d1, a second width d2, and a third width d3, respectively. In this case, the first width d1, the second width d2, and the third width d3 may all be same width.

The second barrier metal 810 may be formed along a lower surface and a side surface of the sixth recess 720. Accordingly, the uppermost portion of the upper surface of the second barrier metal 810 may be flush with the second and third gate spacers 260 and 1160, the second and third the high-k dielectric films 220 and 1120, and the second and third capping films 250 and 1150.

The second metal contact 800 may fill the sixth recess 720. The second metal contact 800 may be formed on the second barrier metal 810. The upper surface of the second metal contact 800 may be flush with the uppermost portion of the upper surface of the second barrier metal 810, the upper surfaces of the second and third gate spacers 260 and 1160, the upper surfaces of the second and third high-k dielectric films 220 and 1120, and the upper surfaces of the second and third capping films 250 and 1150.

Referring to FIG. 13, the second metal contact 800 may extend in a second direction Y1. The second metal contact 800 may be formed between the second and third gate electrodes G2 and G3. The second metal contact 800 may be disposed between the second and third gate electrodes G2 and G3 in the first direction X1 and may elongate in the second direction Y1.

A second silicide 721 may be formed between the second barrier metal 810 and the third source/drain 700. The second silicide 721 may be formed to enhance resistance characteristic between the second barrier metal 810 and the third source/drain 700.

In a semiconductor device according to some exemplary embodiments, both metal contact and metal resistor may be formed on the same fin. At this time, the number of metal contacts may be greater than the number of metal resistors. However, exemplary embodiments are not limited to the example given above.

Hereinbelow, a semiconductor device according to some exemplary embodiments will be described with reference to FIG. 15. In the following description, description overlapped with the exemplary embodiments already provided above will not be described or described as briefly as possible for the sake of brevity.

Figure 15:
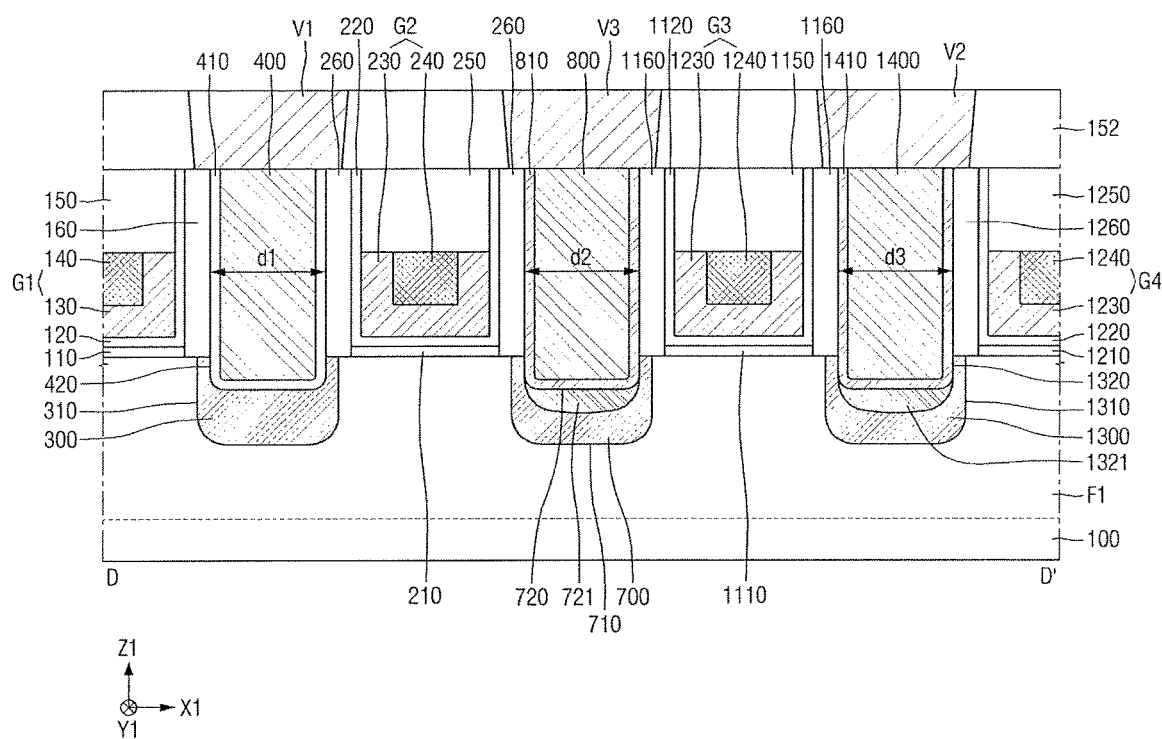
FIG. 15 illustrates a cross sectional view of a semiconductor device according to some exemplary embodiments.

FIG. 15 illustrates cross sectional views of a semiconductor device according to some exemplary embodiments.

Referring to FIG. 15, the semiconductor device according to some exemplary embodiments may include the second interlayer insulating film 152, the first via V1, the second via V2, and the third via V3.

The second interlayer insulating film 152 may be formed on the first to fourth gate electrodes G1 to G4, on the metal resistor 400, and on the first and second metal contacts 1400 and 800. The second interlayer insulating film 152 may be the same material as the first interlayer insulating film 115.

The first via V1 may pass through the second interlayer insulating film 152 to electrically connect to the metal resistor 400. The first via V1 may serve to connect the metal resistor 400 to the upper structure.

The second via V2 and the third via V3 may pass through the second interlayer insulating film 152 to electrically connect to the first metal contact 1400 and the second metal contact 800, respectively. The second via V2 and the third via V3 may serve to connect the first metal contact 1400 and the second metal contact 800 to the upper structure.

Hereinbelow, a method for fabricating a semiconductor device according to some exemplary embodiments will be described with reference to FIGS. 8 to 11, and 16 to 24. In the following description, description overlapped with the exemplary embodiments already provided above will not be described or described as briefly as possible for the sake of brevity.

FIGS. 16 to 24 are views illustrating intermediate stages of fabrication, provided to explain a method for fabricating a semiconductor device according to some exemplary embodiments.

Figure 16:
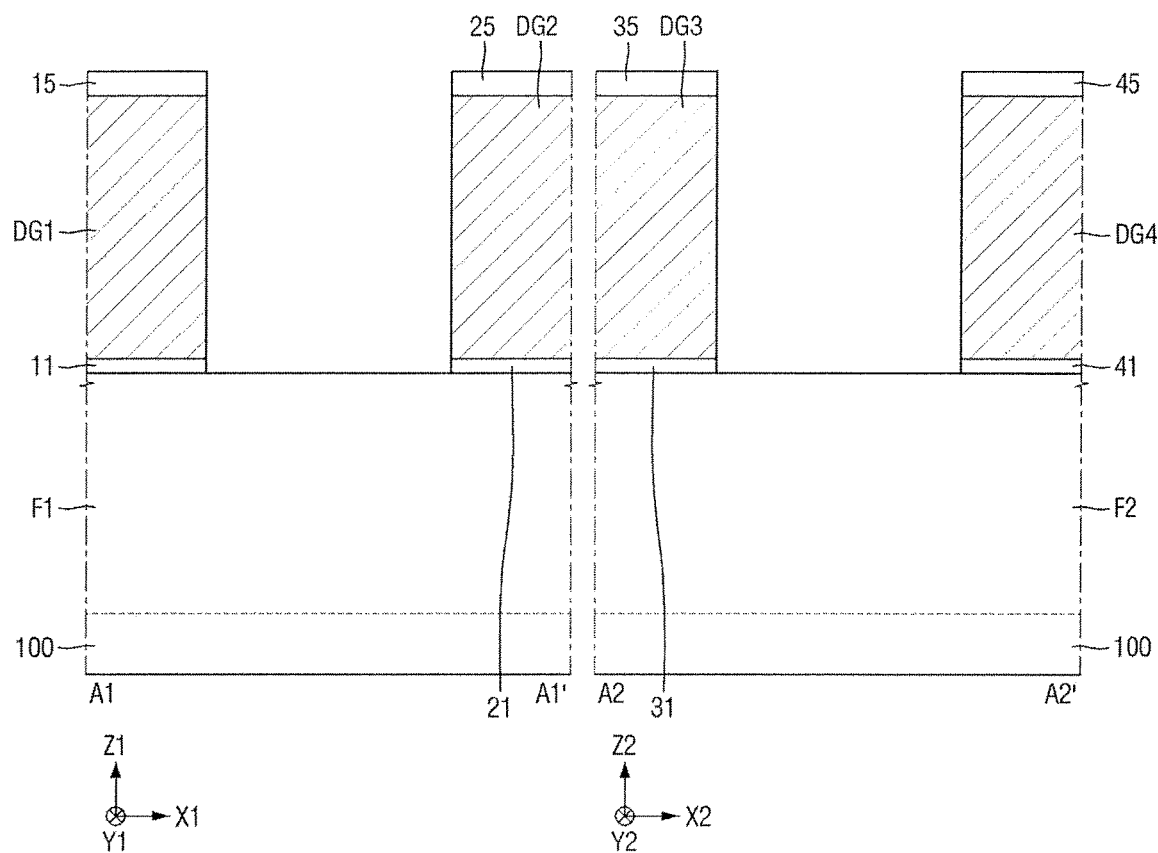
FIGS. 16 to 24 illustrate cross sectional views of stages in a method for fabricating a semiconductor device according to some exemplary embodiments.

First, referring to FIG. 16, a first dummy gate electrode DG1 and a second dummy gate electrode DG2 are formed on the first fin F1. Further, a third dummy gate electrode DG3 and a fourth dummy gate electrode DG4 are formed on the second fin F2.

The first and second dummy gate electrodes DG1 and DG2 may extend on the first fin F1 in the second direction Y1 intersecting the first direction X1 in which the first fin F1 extends. The third and fourth dummy gate electrodes DG3 and DG4 may likewise extend on the second fin F2 in the fifth direction Y2 intersecting the fourth direction X2 in which the second fin F2 extends.

First and second dummy gate insulating films 11 and 21 may be formed between the first and second gate electrodes DG1 and DG2 and the first fin F1, respectively. Third and fourth dummy gate insulating films 31 and 41 may be likewise formed between the third and fourth gate electrodes DG3 and DG4 and the second fin F2, respectively.

First and second dummy gate capping films 15 and 25 may be formed on the first and second dummy gate electrodes DG1 and DG2, respectively. Third and fourth dummy gate capping films 35 and 45 may be likewise formed on the third and fourth dummy gate electrodes DG3 and DG4, respectively.

Figure 17:
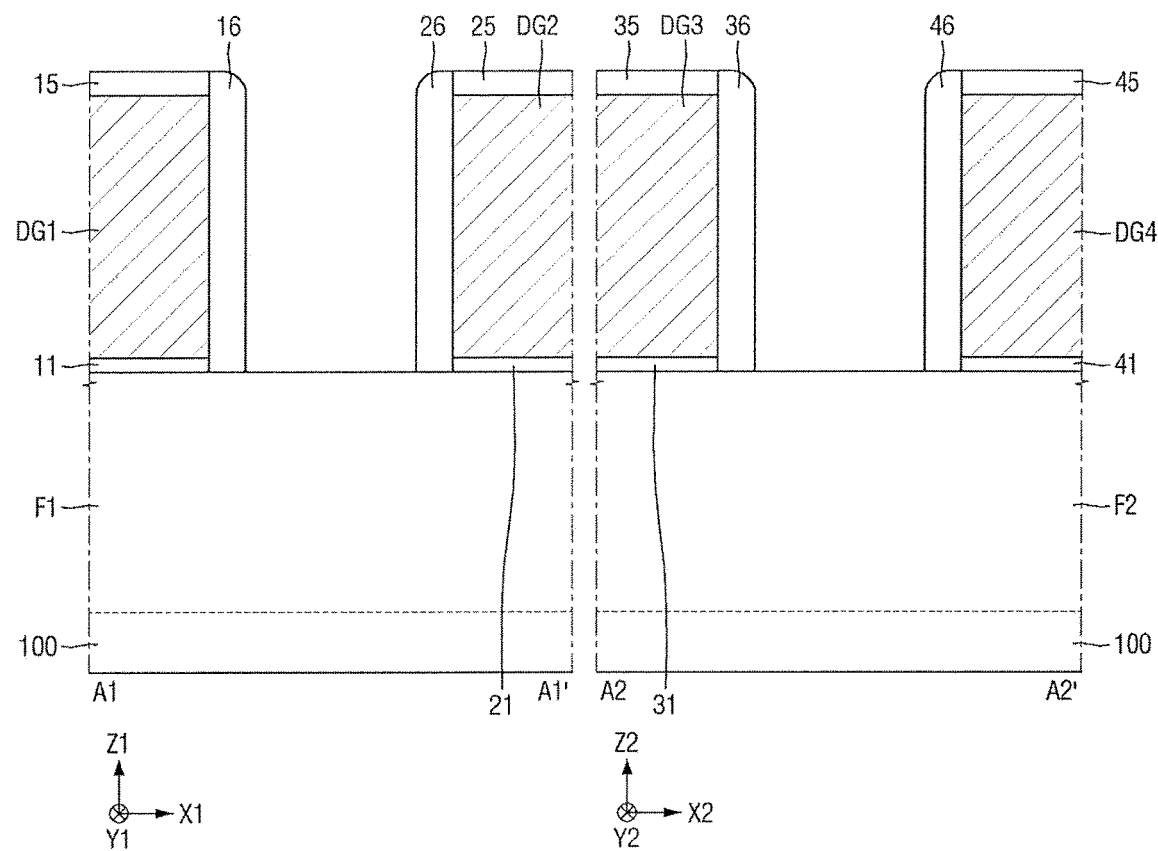

Referring to FIG. 17, First and second dummy gate spacers 16 and 26 are then formed on the side surfaces of the first and second dummy gate electrodes DG1 and DG2, respectively. Further, third and fourth dummy gate spacers 36 and 46 are formed on the side surfaces of the third and fourth dummy gate electrodes DG3 and DG4, respectively.

Figure 18:
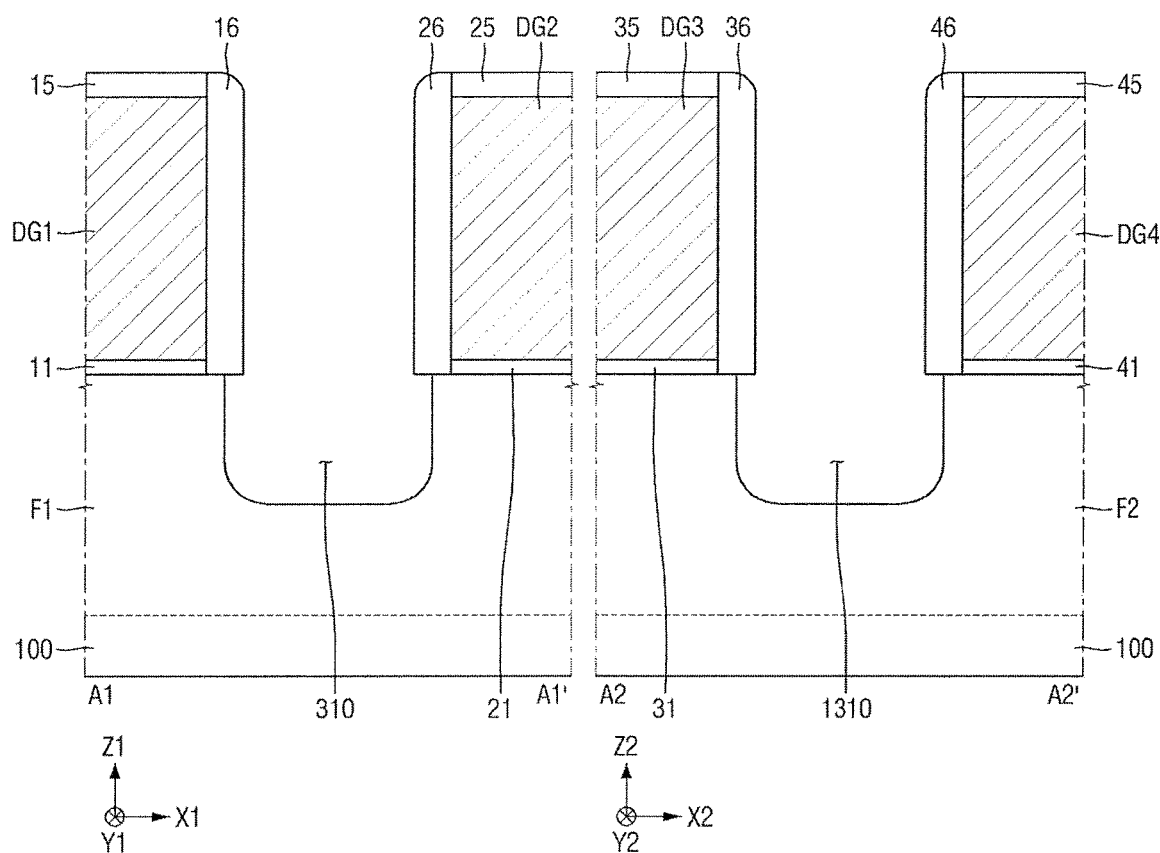

Then, referring to FIG. 18, the first recess 310 is formed in the first fin F1, and the third recess 1310 is formed in the second fin F2, e.g., via isotropic etching. The first recess 310 may partially expose lower surfaces of the first and second dummy gate spacers 16 and 26. The third recess 1310 may likewise partially expose lower surfaces of the third and fourth dummy gate spacers 36 and 46.

Figure 19:
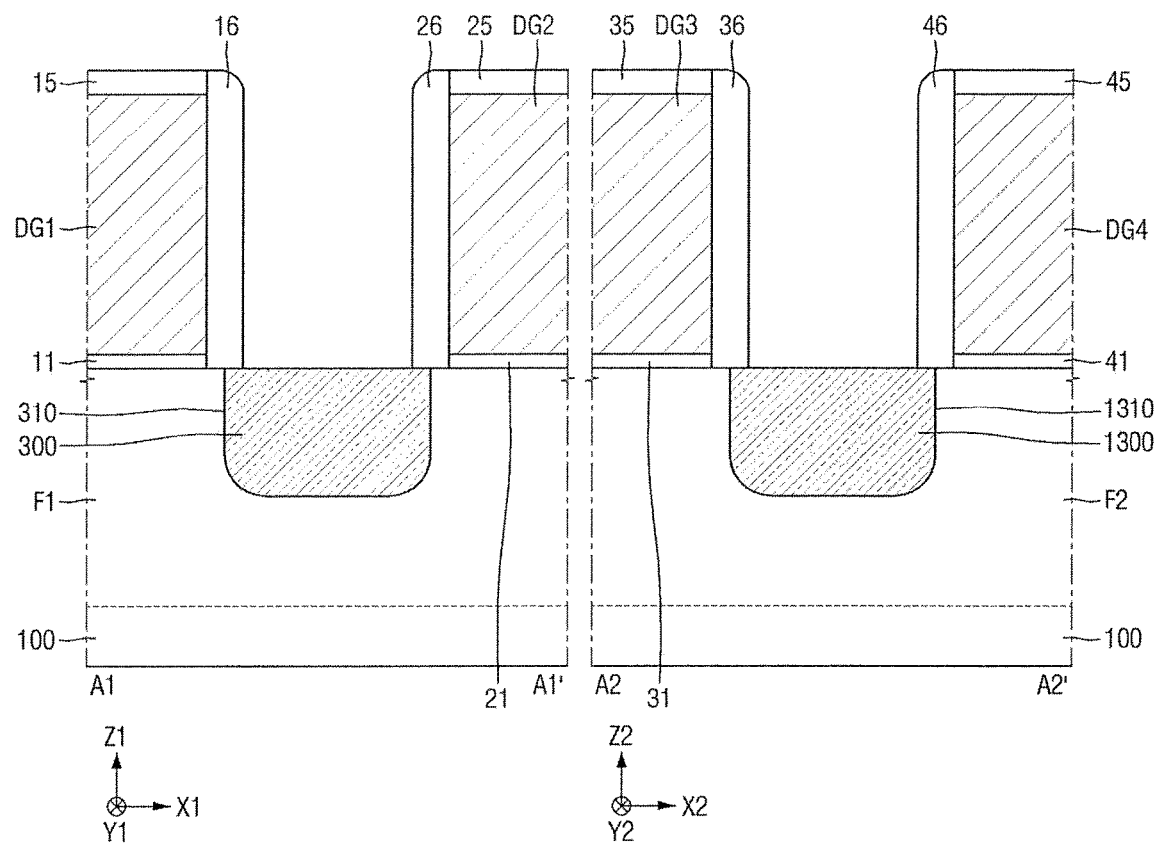

Next, referring to FIG. 19, the first source/drain 300 filling the first recess 310 is formed, and the second source/drain 1300 filling the third recess 1310 is formed.

Figure 20:
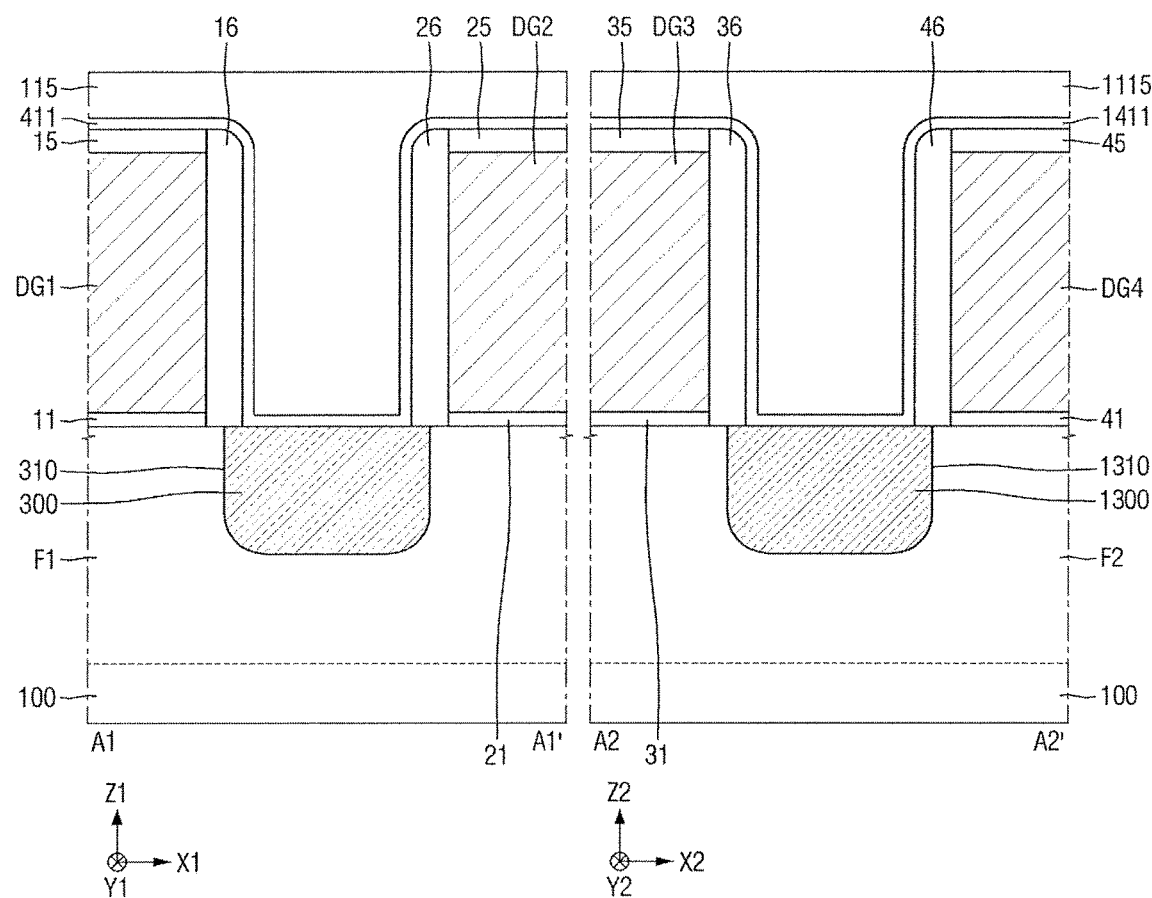

Next, referring to FIG. 20, the first etch stop film 411 overlaying the first and second dummy gate capping films 15 and 25, the first and second dummy gate spacers 16 and 26, and the first source/drain 300, is formed, e.g., conformally. A second stop film 1411 overlaying the third and fourth dummy gate capping films 35 and 45, the third and fourth dummy gate spacers 36 and 46, and the second source/drain 1300, is likewise formed, e.g., conformally.

The first etch stop film 411 may be formed along the surfaces of the first and second dummy gate capping films 15 and 25, the first and second dummy gate spacers 16 and 26, and the first source/drain 300. The second etch stop film 1411 may be formed along the third and fourth dummy gate capping films 35 and 45, the third and fourth dummy gate spacers 36 and 46, and the second source/drain 1300. Next, the first interlayer insulating film 115 overlaying the first region I, and the fourth interlayer insulating film 1115 overlaying the second region II are formed to, e.g., completely, fill the respective openings defined by the first and fourth interlayer insulating films 115 and 1115.

Figure 21:
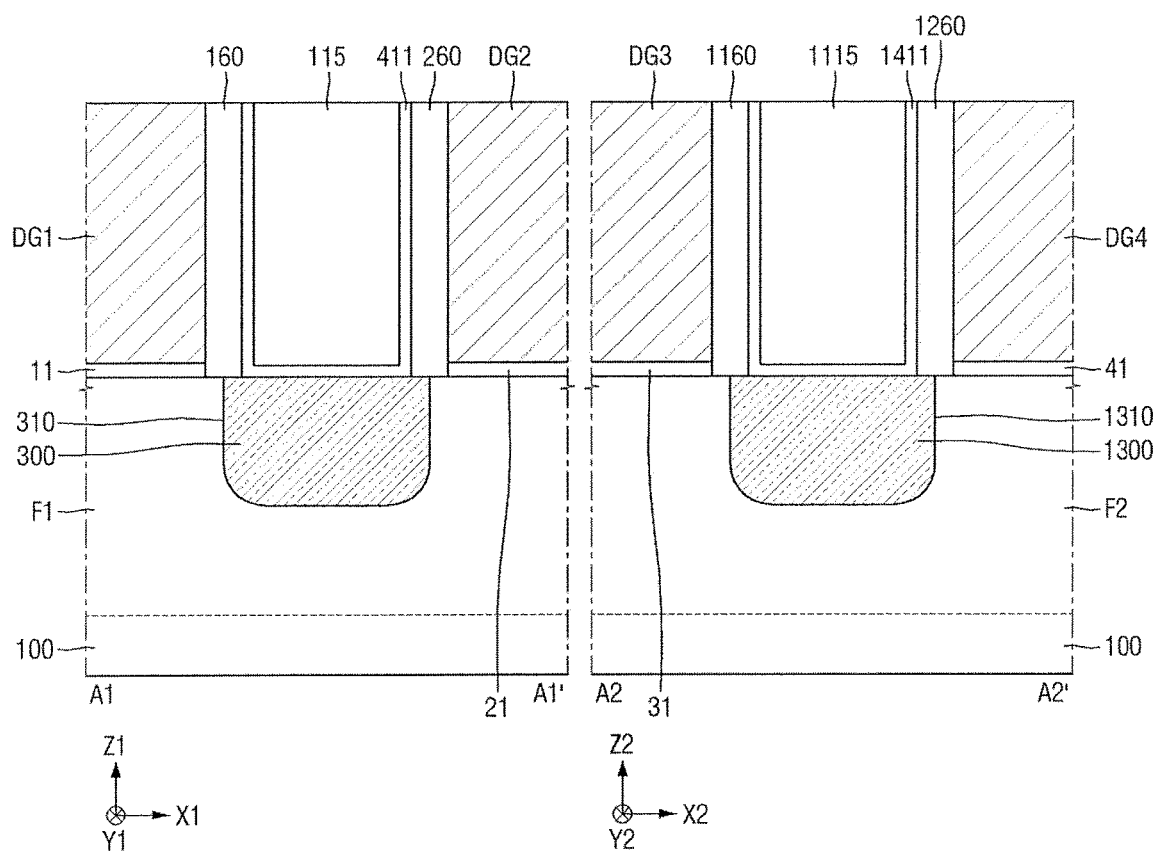

Next, referring to FIG. 21, a planarization process is performed. The planarization process may be chemical mechanical polishing (CMP). The first and second dummy gate capping films 15 and 25 and the third and fourth dummy gate capping films 35 and 45 may be completely removed by the planarization process. Further, when upper portions of the first and second dummy gate spacers 16 and 26 and the third and fourth dummy gate spacers 36 and 46 are removed, the first and second gate spacers 160 and 260 and the third and fourth gate spacers 1160 and 1260 may be formed. Further, the first and second dummy gate electrodes DG1 and DG2, the first and second gate spacers 160 and 260, the first etch stop film 411, the first interlayer insulating film 115, the third and fourth dummy gate electrodes DG3 and DG4, the third and fourth gate spacers 1160 and 1260, and the fourth interlayer insulating film 1115 may have the upper surfaces flush with one another.

Figure 22:
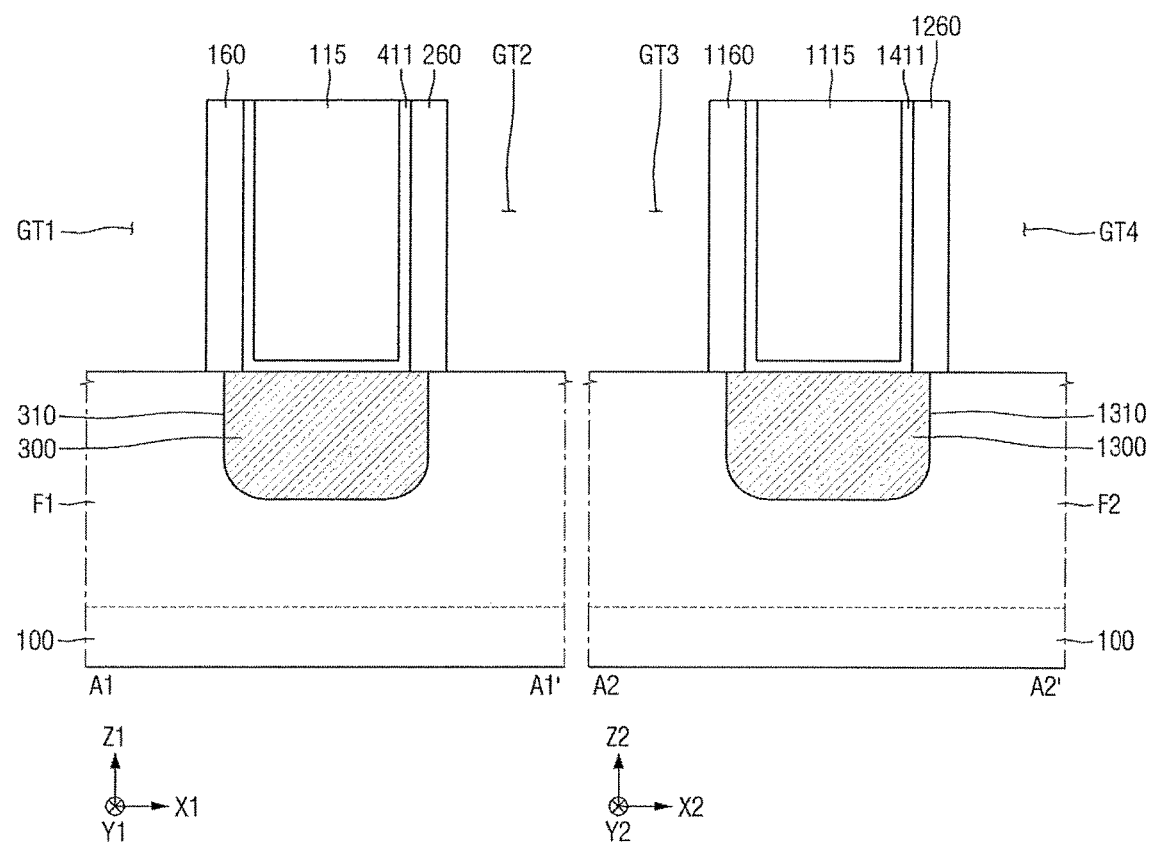

Then, referring to FIG. 22, the first and second dummy gate electrodes DG1 and DG2, the third and fourth dummy gate electrodes DG3 and DG4, the first and second dummy gate insulating films 11 and 21, and the third and fourth dummy gate insulating films 31 and 41 are removed. Accordingly, the first to fourth gate trenches GT1 to GT4 may be formed, respectively.

Figure 23:
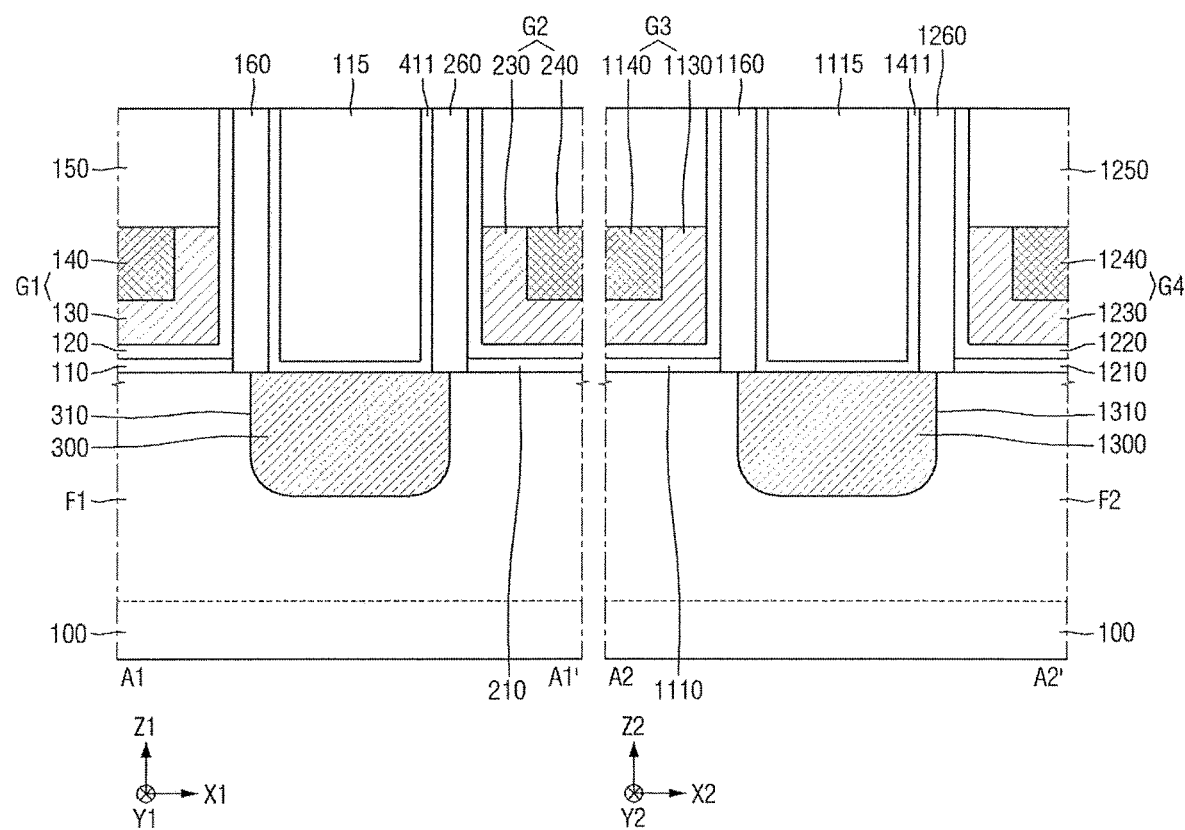

Next, referring to FIG. 23, a gate replacement process is performed. That is, first to fourth gate electrodes G1 to G4 are formed in the first to fourth gate trenches GT1 to GT4, respectively. Specifically, a first interfacial layer 110, a first high-k dielectric film 120, a first gate electrode G1, and a first capping film 150 are formed in the first gate trench GT1. A second interfacial layer 210, a second high-k dielectric film 220, a second gate electrode G2, and a second capping film 250 are formed in the second gate trench GT2. Further, a third interfacial layer 1110, a third high-k dielectric film 1120, a third gate electrode G3, and a third capping film 1150 are formed in the third gate trench GT3. A fourth interfacial layer 1210, a fourth high-k dielectric film 1220, a fourth gate electrode G4, and a fourth capping film 1250 are formed in the fourth gate trench GT4.

Figure 24:
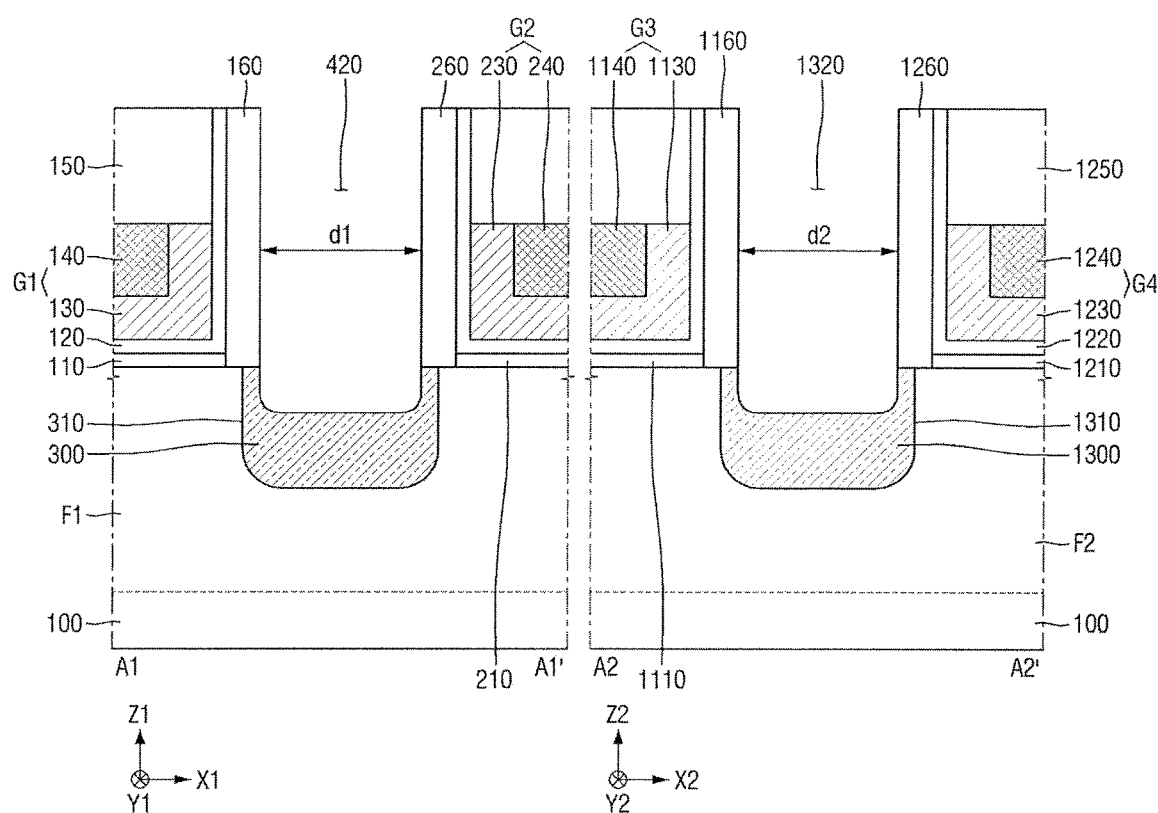

Next, referring to FIG. 24, a second recess 420 and a fourth recess 1320 are formed by etching the first source/drain 300 and the second source/drain 1300, respectively. The width d1 of the second recess 420 and the width d2 of the fourth recess 1320 may be substantially the same.

Next, referring to FIGS. 8 to 11, the first insulating liner 410 and the metal resistor 400 are formed in the second recess 420 of the first region I, and the first silicide 1321, the first barrier metal, and the first metal contact 1400 are formed in the fourth recess 1320 of the second region II. For example, the first insulating liner 410 and the first barrier metal may be formed conformally via atomic layer deposition (ALD), chemical vapor deposition (CVD), etc., e.g., thickness of the insulating layers may be adjusted to tune resistance of the resistor. For example, deposition of the metal resistor 400 and the first metal contact 1400 may be performed by metal deposition, e.g., TiN, TaN, TiAl, etc., via ALD or CVD, while resistivity may be adjusted by tuning composition and temperature.

By way of summation and review, embodiments provide a semiconductor device with improved operating characteristics. Embodiments also provide a method for fabricating a semiconductor device with improved operating characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first recess in the substrate;
a first source/drain filling the first recess;
a vertical metal resistor on the first source/drain, a bottom of the vertical metal resistor having an overlapped portion overlapping the first source/drain and a bottom of the first recess in a top view;
first and second gate electrodes on the substrate and at opposite sides of the vertical metal resistor, a longitudinal direction of the vertical metal resistor being parallel to a longitudinal direction of the first and second gate electrodes in a top view; and
an insulating liner separating the vertical metal resistor from the first source/drain, at least a portion of the insulating liner being directly between the first source/drain and an entirety of the overlapped portion of the vertical metal resistor,
wherein the first source/drain is not electrically connected to the vertical metal resistor.

2. The semiconductor device as claimed in claim 1, further comprising first and second gate spacers on opposite sides of each one of the first and second gate electrodes, respectively.

3. The semiconductor device as claimed in claim 2, further comprising a second recess between the first and second gate spacers, the second recess having the entirety of the vertical metal resistor and the insulating liner therein.

4. The semiconductor device as claimed in claim 3, wherein opposite sidewalls of the second recess are defined by the first and second gate spacers, respectively.

5. The semiconductor device as claimed in claim 3, further comprising an interlayer insulating film filling between the first and second gate spacers, opposite sidewalls of the second recess being defined by the interlayer insulating film.

6. The semiconductor device as claimed in claim 3, wherein the insulating liner is along a sidewall of the second recess to fill a portion of the second recess, and the vertical metal resistor completely fills the second recess on the insulating liner.

7. The semiconductor device as claimed in claim 2, wherein a height of upper surfaces of the first and second gate spacers is same as a height of an upper surface of the vertical metal resistor.

8. The semiconductor device as claimed in claim 2, further comprising first and second capping films on the first and second gate electrodes, respectively, the first and second capping films being in contact with inner surfaces of the first and second gate spacers.

9. The semiconductor device as claimed in claim 8, wherein a height of the first and second capping films is same as a height of the vertical metal resistor.

10. The semiconductor device as claimed in claim 1, further comprising a fin protruding from the substrate and extending in a first direction, the first recess being in the fin.

11. The semiconductor device as claimed in claim 10, wherein the vertical metal resistor extends on the fin in a second direction intersecting the first direction.

12. A semiconductor device, comprising:
a substrate;
first and second gate electrodes extending in parallel in a first direction on the substrate;
first and second gate spacers on side surfaces of the first and second gate electrodes, respectively;
a first recess between the first and second gate electrodes;
a source/drain filling the first recess;
a second recess having the first and second gate spacers as sidewalls and an upper surface of the source/drain as a bottom surface;
a metal resistor filling the second recess on the source/drain, a bottom of the metal resistor having an overlapped portion overlapping the source/drain and a bottom of the first recess in a top view; and
an insulating liner between the metal resistor and the source/drain to prevent contact between the metal resistor and the source/drain, at least a portion of the insulating liner being directly between the source/drain and an entirety of the overlapped portion of the metal resistor,
wherein the metal resistor extends in the first direction between the first and second gate electrodes in parallel with the first and second gate electrodes, and
wherein the source/drain is not electrically connected to the metal resistor.

13. The semiconductor device as claimed in claim 12, wherein the insulating liner is along a bottom surface and a sidewall of the second recess to fill a portion of the second recess.

14. The semiconductor device as claimed in claim 13, wherein the sidewall of the second recess includes an upper sidewall having first and second gates and a lower sidewall having the source/drain.

15. The semiconductor device as claimed in claim 12, further comprising a fin protruding from the substrate and extending in a second direction intersecting the first direction, the first and second gate electrodes, and the first and second recesses being on the fin.

16. The semiconductor device as claimed in claim 12, further comprising first and second capping films on the first and second gate electrodes, respectively, the first and second capping films being on inner surfaces of the first and second gate spacers, respectively.

17. The semiconductor device as claimed in claim 16, wherein heights of the first and second capping films, the first and second gate spacers, and an upper surface of the metal resistor are all the same.

18. A semiconductor device, comprising:
a substrate having first and second regions;
first and second recesses in the first and second regions of the substrate, respectively;
first and second source/drains filling the first and second recesses, respectively;
an insulating liner on the first source/drain;
a metal resistor on the insulating liner, a bottom of the metal resistor having an overlapped portion overlapping the first source/drain and a bottom of the first recess in a top view, and at least a portion of the insulating liner being directly between the first source/drain and an entirety of the overlapped portion of the metal resistor the first source/drain;
a metal contact on the second source/drain; and
a silicide between the metal contact and the second source/drain, the silicide being only on the second source/drain among the first source/drain and the second source/drain,
wherein the first source/drain is not electrically connected to the metal resistor.

19. The semiconductor device as claimed in claim 18, further comprising:
a third recess filled with the metal resistor;
a fourth recess filled with the metal contact; and
a barrier metal along a bottom surface and a side surface of the fourth recess, the barrier metal filling a portion of the fourth recess.

20. The semiconductor device as claimed in claim 19, wherein widths of the third and fourth recesses are the same.

* * * * *